(12) United States Patent
Vyetrenko et al.

(10) Patent No.: US 8,914,713 B2
(45) Date of Patent: Dec. 16, 2014

(54) ERASURE CODING SCHEME FOR DEADLINES

(71) Applicant: California Institute of Technology, Pasadena, CA (US)

(72) Inventors: Svitlana Vyetrenko, New York, NY (US); Tracey C. Ho, Pasadena, CA (US); Hongyi Yao, Pasadena, CA (US); Omer Tekin, Konya (TR)

(73) Assignee: California Institute of Technology, Pasadena, CA (US)

( * ) Notice: Subject to any disclaimer, the term of this patent is extended or adjusted under 35 U.S.C. 154(b) by 154 days.

(21) Appl. No.: 13/625,857

(22) Filed: Sep. 24, 2012

(65) Prior Publication Data

US 2013/0080861 A1    Mar. 28, 2013

Related U.S. Application Data

(60) Provisional application No. 61/538,648, filed on Sep. 23, 2011.

(51) Int. Cl.
| | | |
|---|---|---|
| *H03M 13/00* | (2006.01) | |
| *G11C 29/00* | (2006.01) | |
| *H03M 13/37* | (2006.01) | |
| *H03M 13/15* | (2006.01) | |
| *H03M 13/45* | (2006.01) | |
| *H03M 13/29* | (2006.01) | |
| *H04L 1/00* | (2006.01) | |

(52) U.S. Cl.
CPC .......... *H03M 13/373* (2013.01); *H03M 13/154* (2013.01); *H03M 13/455* (2013.01); *H03M 13/293* (2013.01); *H04L 1/0067* (2013.01); *H04L 1/0082* (2013.01); *H04L 1/0061* (2013.01); *H04L 1/0078* (2013.01); *H04L 1/0077* (2013.01)

USPC .......... 714/776; 714/799; 714/821; 714/752; 714/768; 714/774; 370/456; 370/216

(58) Field of Classification Search
CPC ............ H03M 13/373; H03M 13/455; H03M 13/154; H03M 13/293; H04L 1/0078; H04L 1/0061; H04L 1/0067; H04L 1/0082
USPC ................. 714/776, 799, 821, 752, 768, 774; 370/456, 216
See application file for complete search history.

(56) References Cited

U.S. PATENT DOCUMENTS

| | | | | |
|---|---|---|---|---|
| 7,003,712 | B2 * | 2/2006 | Martinian et al. | 714/761 |
| 7,930,617 | B1 * | 4/2011 | Gass et al. | 714/784 |

(Continued)

OTHER PUBLICATIONS

Tekin et al., Erasure correction for nested receivers, Sep. 28, 2011, IEEE, pp. 1454-1461.*

(Continued)

*Primary Examiner* — John J Tabone, Jr.
(74) *Attorney, Agent, or Firm* — Gates & Cooper LLP

(57) ABSTRACT

Error correction coding for streaming communication is provided. A streaming problem is modeled as a non-multicast network problem with a nested receiver structure. Each packet in the streaming problem corresponds to a link, and each deadline in the streaming problem corresponds to a receiver in the non-multicast network problem. For the non-multicast network problem, content to be transmitted in multiple packets to multiple receivers is obtained. Each of the receivers is required to decode specific independent messages from the content, at given time steps, and has access to a subset of the content received by another receiver. The content is allocated into multiple packets to be transmitted on multiple links. No coding occurs across information demanded by different receivers. A capacity region defines a set of information rate vectors that can be communicated to the receivers successfully. A rate vector is successfully communicated if it complies with various inequalities.

21 Claims, 4 Drawing Sheets

(56) References Cited

U.S. PATENT DOCUMENTS

| | | | | |
|---|---|---|---|---|
| 8,068,426 | B2* | 11/2011 | Sundararajan et al. | 370/235 |
| 8,230,316 | B2* | 7/2012 | Melliar-Smith et al. | 714/801 |
| 8,429,503 | B2* | 4/2013 | Okamura et al. | 714/776 |
| 8,443,255 | B2* | 5/2013 | Jiang et al. | 714/758 |
| 8,473,833 | B2* | 6/2013 | Melliar-Smith et al. | 714/801 |
| 2003/0101408 | A1* | 5/2003 | Martinian et al. | 714/776 |
| 2009/0161606 | A1* | 6/2009 | Akkarakaran et al. | 370/329 |
| 2012/0020276 | A1* | 1/2012 | Markman | 370/312 |
| 2012/0246546 | A1* | 9/2012 | Melliar-Smith et al. | 714/776 |
| 2012/0265523 | A1* | 10/2012 | Greer et al. | 704/201 |

OTHER PUBLICATIONS

Ho, On error and erasure correction coding for networks and deadlines, Oct. 2011, Caltech, pp. 1-68.*

Cai et al., "Network coding and error correction," in ITW2002 Bangalore, India, Oct. 2002, pp. 119-122.

Yeung et al., "Network error correction, part I: Basic concepts and upper bounds," Commun. Inf. Syst., vol. 6, No. 1, pp. 19-36, 2006.

Cai et al., "Network error correction, part II: Lower bounds," Commun. Inf. Syst., vol. 6, No. 1, pp. 37-54, 2006.

Chan et al., "Mission impossible: Computing the network coding capacity region," in Proc. IEEE International Symposium on Information Theory, Jul. 2008, pp. 320-324.

Dana et al.,"Capacity of wireless erasure networks," IEEE Transactions on Information Theory, vol. 52, No. 3, pp. 789-804, Mar. 2006.

Erez et al., "Capacity region and network codes for two receivers multicast with private and common data," in Proc. IEEE International Symposium on Information Theory, 2003, 1 page.

Harvey et al., "Tighter cut-based bounds for k-pairs communication problems," in Proc. 43rd Allerton Conference on Communication, Control, and Computing, Monticello, IL, Sep. 2005, 10 pages.

Jaggi et al., "Resilient network coding in the presence of byzantine adversaries," Information Theory, IEEE Transactions on, vol. 54, No. 6, pp. 2596-2603, Jun. 2008.

Koetter et al., "An algebraic approach to network coding," IEEE/ACMTransactions on Networking, vol. 11, No. 5, pp. 782-795, Oct. 2003.

Kotter et al., "Coding for errors and erasures in random network coding," IEEE Transactions on Information Theory, vol. 54, No. 8, Aug. 2008, pp. 3579-3591.

Lun et al., "On coding for reliable communication over packet networks," Physical Communication, vol. 1, No. 5, Mar. 2008, pp. 3-20.

Martinian et al., "Burst erasure correction codes with low decoding delay," IEEE Trans. Inf. Theory, vol. 50, No. 10, pp. 2494-2502, Oct. 2005.

Martinian et al., "Delay-optimal burst erasure code construction," in ISIT2007, Nice, France, IEEE, Jun. 2007, pp. 1006-1010.

Ngai et al., "Multisource network coding with two sinks," in Communications, Circuits and Systems, 2004. ICCCAS 2004. 2004 International Conference on, vol. 1, Jun. 2004, pp. 34-37.

Ramamoorthy et al., "The single source two terminal network with network coding," in Canadian Workshop on Information Theory, Aug. 20, 2009, pp. 1-4.

Silva et al., "A rank-metric approach to error control in random network coding," IEEE Transactions on Information Theory, vol. 54, No. 9, pp. 3951-3967, Sep. 2008.

Vyetrenko et al., "Rate regions for coherent and noncoherent multisource network error correction," in Proc. IEEE International Symposium on Information Theory, Seoul, Korea, Jun.-Jul. 2009, pp. 1001-1005.

Vyetrenko et al., "Outer bounds on the error correction capacity region for non-multicast networks," Fourty-Eighth Annual Allerton Conference, Allerton House, UIUC, Illinois, Sep.-Oct. 2010, pp. 867-874.

Leong et al., "Erasure Coding for Real-Time Streaming", presented at the ISIT 2012 conference, Jul. 16, 2012, 12 pages.

* cited by examiner

ERASURE CODING SCHEME FOR DEADLINES

CROSS-REFERENCE TO RELATED APPLICATIONS

This application claims the benefit under 35 U.S.C. Section 119(e) of the following co-pending and commonly-assigned U.S. provisional patent application(s), which is/are incorporated by reference herein:

Provisional Application Ser. No. 61/538,648, filed on Sep. 23, 2011, by Svitlana Vyetrenko, Tracey C. Ho, Hongyi Yao, and Omer Tekin, entitled "Erasure Coding Scheme for Deadlines".

This application further incorporates by reference "Erasure Coding for Real-Time Streaming, by Derek Leong and Tracey Ho, Conference Paper, IEEE International Symposium on Information Theory (ISIT), July 2012, arXiv: 1207.3582 [cs.IT].

STATEMENT REGARDING FEDERALLY SPONSORED RESEARCH AND DEVELOPMENT

The invention was made with Government support under Grant No. CNS 0905615 awarded by the National Science Foundations and Grant No. FA9550-10-1-0166 awarded by the United States Air Force. The Government has certain rights in this invention.

BACKGROUND OF THE INVENTION

1. Field of the Invention

The present invention relates generally to streaming packets of information, and in particular, to a method, apparatus, and article of manufacture for packet erasure/error correction coding with a nested receiver structure.

2. Description of the Related Art (Note: This application references a number of different publications as indicated throughout the specification by reference numbers enclosed in brackets, e.g., [x]. A list of these different publications ordered according to these reference numbers can be found below in the section entitled "References." Each of these publications is incorporated by reference herein.)

Embodiments of the invention evaluate packet erasure/error correction coding with a nested receiver structure, where the set of packets received by each receiver i is a subset of that received by the next receiver i+1. A natural setting in which this type of structure arises is with temporal demands: each receiver corresponds to a particular deadline in the received packet stream by which a particular piece of information must be decoded, and has access to all earlier observations. The protocol can specify an arbitrary set of deadlines and demands.

The prior art fails to provide the ability to construct codes that can correct any z packet erasures (or errors) for all feasible information rates, without a priori knowledge of which packets will be erased (erroneous). By making a connection with prior work (of the inventors of the present application) on non-multicast network error correction, one may characterize the capacity region of feasible demand vectors for any given nested structure (set of deadlines) and any z erasures (errors). In particular, embodiments of the invention provide a capacity-achieving coding scheme where no coding occurs across information demanded by different receivers.

The network error correction problem, where transmissions on an unknown set of z links are arbitrarily corrupted, was introduced by Cai and Yeung ([1], [2], and [3]) for single-source multicast. They characterized the capacity region and showed a connection between network error correction and network erasure correction by generalizing classical coding theory to the network setting. Network coding for multicast packet erasure correction was considered in [4] and [5]. The problem of multicast non-coherent error correction, where the network topology and/or network code are not known a priori, was studied in [6], [7], [8].

For non-multicast networks, finding the capacity region of a general network even without errors is an open problem. The error-free capacity regions for some special cases, such as single-source two-sink networks ([9], [10], [11]) and single-source disjoint- or nested-demand networks ([12]) with multiple sinks, are given by the cutset bounds. On the other hand, examples of non-multicast networks whose error-free capacity regions are not given by cutset bounds appear in [13] and [14].

For non-multicast error correction, prior work of the present inventors [15] has shown that unlike the error-free case, cutset bounds are loose in general for single-source two-sink networks with errors, and refined bounds were developed for non-multicast networks. Embodiments of the present invention build on some of the techniques developed in that work.

[16]-[17] has constructed streaming codes that minimize the delay required to correct burst errors of given length.

SUMMARY OF THE INVENTION

Embodiments of the invention provide a coding scheme to correct packet erasures in a streaming scenario where specific information must be decided by given deadlines. The spacing of the deadlines and the amount of information required at each deadline can be arbitrarily specified. Prior art methodologies have not established capacity-optimal coding schemes for such a deadline model.

An erasure pattern is a collection of admissible sets of packet erasures such that the demanded information can be recovered by each deadline under any admissible set of erasures. The coding scheme is optimal for a fixed number of erasures in unknown locations, and achieves within a constant ratio of the optimal performance for a family of practical erasure patterns.

The coding scheme of embodiments of the invention follows. For a given erasure pattern, information from successive deadlines is sequentially allocated across packets such that the information from each deadline is spread as uniformly as possible over multiple packets, subject to the packet capacities that remain after allocating information for previous deadlines, and any constraints on when certain information is available to the encoder. Sufficient capacity is allocated for each deadline such that the capacity remaining after any admissible set of erasures is at least the amount demanded by that deadline. Coding is carried out only among information corresponding to the same deadline, with a generic or maximum distance separable code, e.g., random linear coding or Reed Solomon coding.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Hardware Environment

Figure 1:
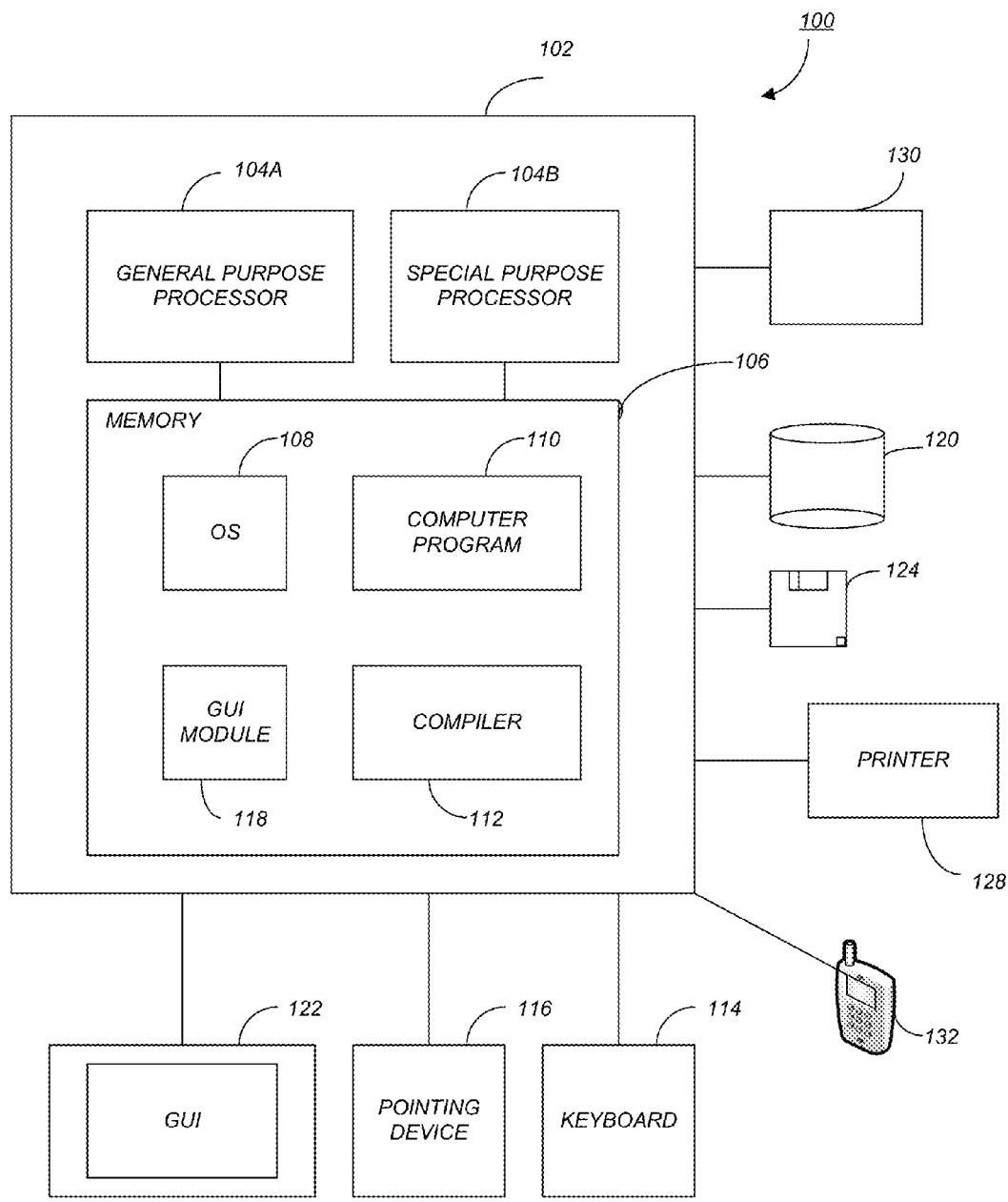
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to, and/or integrated with, other devices, including input/output (I/O) devices such as a keyboard 114, a cursor control device 116 (e.g., a mouse, a pointing device, pen and tablet, touch screen, multi-touch device, etc.) and a printer 128. In one or more embodiments, computer 102 may be coupled to, or may comprise, a portable or media viewing/listening device 132 (e.g., an MP3 player, iPod™, Nook™, portable digital video player, cellular device, personal digital assistant, etc.). In yet another embodiment, the computer 102 may comprise a multi-touch device, mobile phone, gaming system, internet enabled television, television set top box, or other internet enabled device executing on various platforms and operating systems.

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108, to provide output and results.

Output/results may be presented on the display 122 or provided to another device for presentation or further processing or action. In one embodiment, the display 122 comprises a liquid crystal display (LCD) having a plurality of separately addressable liquid crystals. Alternatively, the display 122 may comprise a light emitting diode (LED) display having clusters of red, green and blue diodes driven together to form full-color pixels. Each liquid crystal or pixel of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118. Although the GUI module 118 is depicted as a separate module, the instructions performing the GUI functions can be resident or distributed in the operating system 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of multi-touch devices include mobile devices (e.g., iPhone™, Nexus S™, Droid™ devices, etc.), tablet computers (e.g., iPad™, HP Touchpad™), portable/handheld game/music/video player/console devices (e.g., iPod Touch™, MP3 players, Nintendo 3DS™, PlayStation Portable™, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program 110 instructions. In one embodiment, the special purpose processor 104B is an application specific integrated circuit (ASIC).

The computer 102 may also implement a compiler 112 that allows an application or computer program 110 written in a programming language such as COBOL, Pascal, C++, FORTRAN, or other language to be translated into processor 104 readable code. Alternatively, the compiler 112 may be an interpreter that executes instructions/source code directly, translates source code into an intermediate representation that is executed, or that executes stored precompiled code. Such source code may be written in a variety of programming languages such as Java™, Perl™, Basic™, etc. After completion, the application or computer program 110 accesses and manipulates data accepted from I/O devices and stored in the memory 106 of the computer 102 using the relationships and logic that were generated using the compiler 112.

The computer 102 also optionally comprises an external communication device such as a modem, satellite link, Ethernet card, or other device for accepting input from, and providing output to, other computers 102.

In one embodiment, instructions implementing the operating system 108, the computer program 110, and the compiler 112 are tangibly embodied in a non-transient computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program 110 instructions which, when accessed, read and executed by the computer 102, cause the computer 102 to perform the steps necessary to implement and/or use the present invention or to load the program of instructions into a memory 106, thus creating a special purpose data structure causing the computer 102 to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 102.

Figure 2:
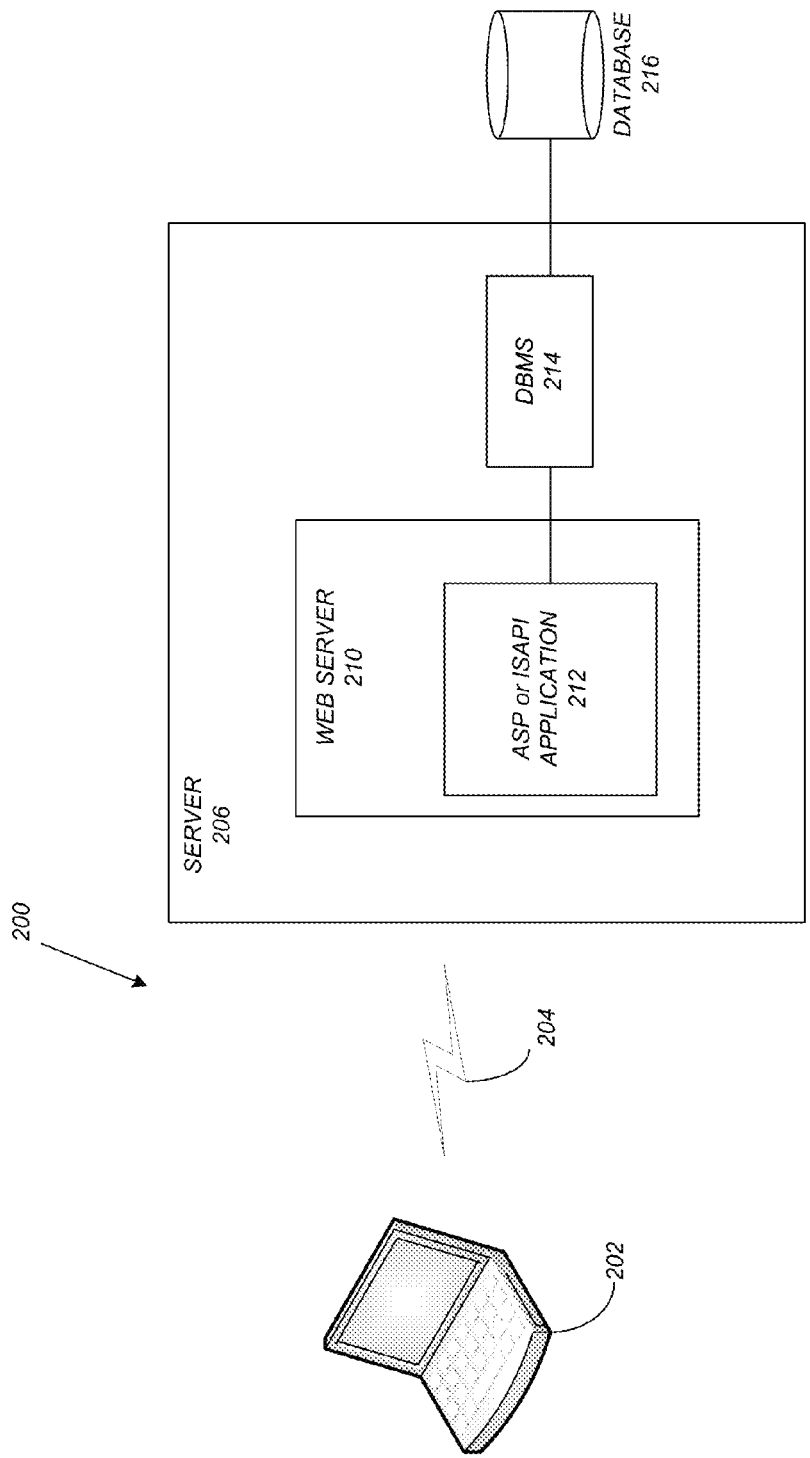
FIG. 2 schematically illustrates a typical distributed computer system using a network to connect client computers to server computers in accordance with one or more embodiments of the invention.

FIG. 2 schematically illustrates a typical distributed computer system 200 using a network 204 to connect client computers 202 to server computers 206. A typical combination of resources may include a network 204 comprising the Internet, LANs (local area networks), WANs (wide area networks), SNA (systems network architecture) networks, or the like, clients 202 that are personal computers or workstations (as set forth in FIG. 1), and servers 206 that are personal computers, workstations, minicomputers, or mainframes (as set forth in FIG. 1). However, it may be noted that different networks such as a cellular network (e.g., GSM [global system for mobile communications] or otherwise), a satellite based network, or any other type of network may be used to connect clients 202 and servers 206 in accordance with embodiments of the invention.

A network 204 such as the Internet connects clients 202 to server computers 206. Network 204 may utilize ethernet, coaxial cable, wireless communications, radio frequency (RF), etc. to connect and provide the communication between clients 202 and servers 206. Clients 202 may execute a client application or web browser and communicate with server computers 206 executing web servers 210. Such a web browser is typically a program such as MICROSOFT INTERNET EXPLORER™, MOZILLA FIREFOX™, OPERA™, APPLE SAFARI™, etc. Further, the software executing on clients 202 may be downloaded from server computer 206 to client computers 202 and installed as a plug-in or ACTIVEX™ control of a web browser. Accordingly, clients 202 may utilize ACTIVEX™ components/component object model (COM) or distributed COM (DCOM) components to provide a user interface on a display of client 202. The web server 210 is typically a program such as MICROSOFT'S INTERNET INFORMATION SERVER™.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of, or connected directly to, client 202 instead of communicating/obtaining the information from database 216 across network 204. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S™ Transaction Server (MTS) to access required data stored in database 216 via an interface such as ADO (Active Data Objects), OLE DB (Object Linking and Embedding DataBase), or ODBC (Open DataBase Connectivity).

Generally, these components 200-216 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 202 and 206 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 202 and 206.

Software Embodiment Overview

Embodiments of the invention are implemented as a software application on a client 202 or server computer 206 and further are configured to stream information, data, packets, etc. to/from each other. Alternatively, in a network, one computer (or other capable device) may be transmitting, multicasting, anycasting, broadcasting, unicasting, geocasting, etc. information and data (e.g., data packets) to one or more recipients (referred to as receivers) across a network. Such receivers may be a computer, set top box, integrated receiver-decoder (IRD), or any other device capable of receiving the transmitted information. Further, the data may be transmitted using a variety of one or more networks (e.g., satellite, cellular, radio frequency, etc.).

In this regard, in today's communication networks (such as the Internet and wireless networks), reliable data delivery is an important question to address. Traditional approaches to networking generally assume forwarding in the network, with robustness to packet loss achieved by retransmissions of lost packets and/or end-to-end forward error correction. Recently, networking coding has been utilized, where network packets are mixed at internal nodes.

In network error correction, there are errors in some links/packets at unknown locations. Some prior art systems code across links/packets. However, given a network and error model, the question arises regarding what communication rates are feasible (information theory) and how to achieve such rates with practical codes (coding theory).

As described above, many network error correction systems work on single-source multicast systems with uniform errors. In a multicast system, all sinks demand the same information, the network links/packets have equal capacity, and z can be erroneous.

Embodiments of the present invention address non-multicast demands for streaming (e.g., real-time streaming or the streaming of stored content). In a non-multicast system, not all sinks demand the same information. As further described above, the capacity of the transmission links is an open problem (even without errors). Accordingly, there may be a need to code across different sinks' data (inter-session coding). Thus, embodiments of the present invention develop error correction codes for streaming, building on techniques developed for bounding network error correction capacity by analyzing three-layer networks.

In the prior art, packets that are streamed across a network may often need to be decoded by given deadlines. Embodiments of the invention provide a mechanism for allocating data packets among different messages while meeting such deadlines, where the spacing of the deadlines and the amount of information required at each deadline can be arbitrarily specified.

Figure 3:
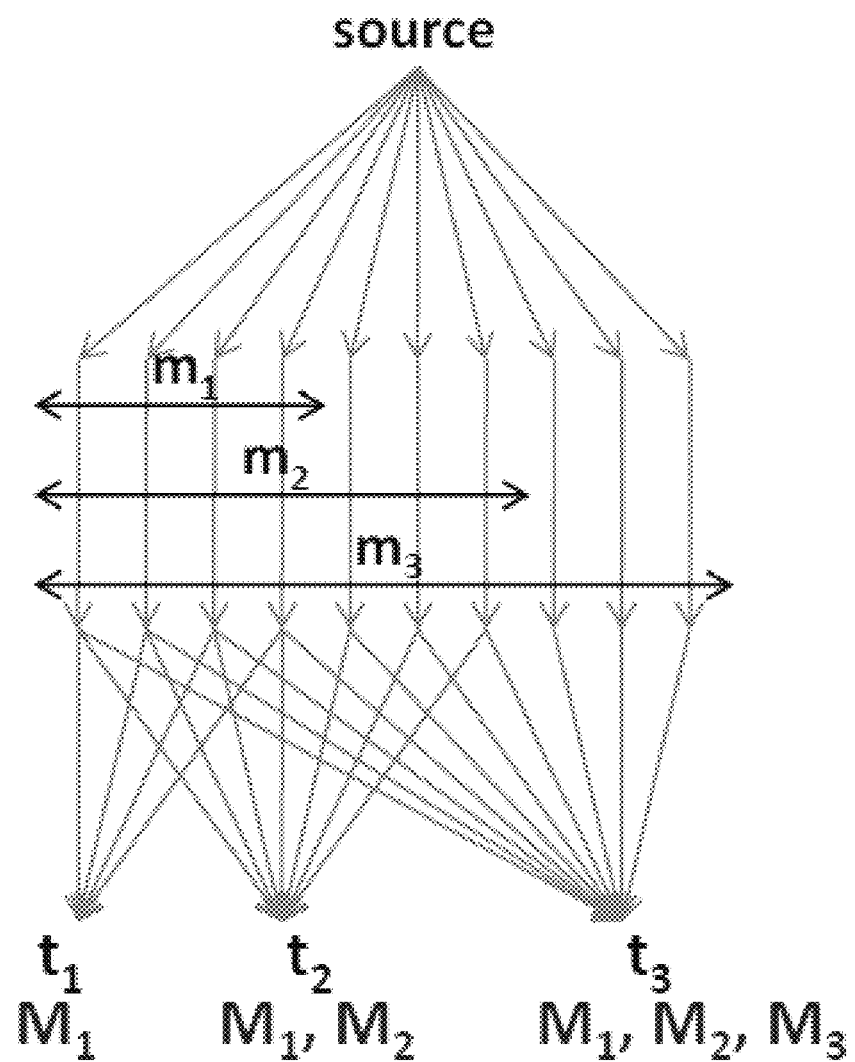
FIG. 3 illustrates a 3-layer nested-network topology with three sinks in accordance with one or more embodiments of the invention.

Referring to FIG. 3, consider a streaming system where at each time step one packet of unit size is transmitted, and the receiver needs to decode specific independent messages $\{M_1, M_2, \ldots M_n\}$ at given time steps $\{m_1, m_2, \ldots m_n\}$ respectively, under any z packet erasures. A goal is to find the erasure-correction capacity region under any z packet erasures as well as a capacity-achieving coding scheme. The problem can be viewed as a z-erasure correction problem on a 3-layer nested network with one source and n sinks $\{t_1, t_2, \ldots, t_n\}$, constructed as follows:

$\mathcal{I} = \{l_1, l_2, \ldots, l_{m_n}\}$ is the set of middle layer links.

The source is connected to the links in $\mathcal{I}$.

Sink $t_i$ is connected to links $l_1, \ldots, l_{m_i}$.

All links have unit capacity.

Only the links in $\mathcal{I}$ can be erased.

In this regard, FIG. 3 illustrates a 3-layer nested-network topology with three sinks (n=3) in accordance with one or more embodiments of the invention. To better understand the invention, a detailed description of the coding scheme follows. Attached as appendix A are the definitions and proof of the coding schemes, the erasure correction capacity, the error correction capacity, and an example in accordance with one or more embodiments of the invention.

Coding Scheme

Intra-Session Coding

An intra-session coding scheme is one in which no coding occurs across information demanded by different receivers. For a given intra-session coding scheme, let $y_i^j$ denote the amount of information corresponding to message $M_j$ transmitted on the link $l_i$. A rate vector $(u_1, u_2, \ldots, u_n)$ is achievable under any z erasures (the definition also extends to other erasure patterns) by this intra-session coding scheme if the inequalities:

$$\forall j: 1 \le j \le n \; u_j \le \sum_{i \in P \cap \{1, \ldots, m_j\}} y_i^j, \quad (1)$$

$$\forall i: 1 \le i \le m_n \; \sum_{j=1}^{n} y_i^j \le 1, \quad (2)$$

are satisfied for every set $P \subseteq I$ where $|P| \ge m_n - z$ (corresponding to unerased links). It may be assumed that the packet size is large enough to accommodate an appropriate generic or random linear erasure code.

"As Uniform As Possible" Coding Scheme

An intra-session coding scheme may also be defined that assigns rates for each successive receiver as uniformly as possible subject to capacity constraints imposed by assignments for previous receivers. For each receiver the process is similar to water-filling with constraints from previous receivers. For a given rate vector $(u_1, u_2, \ldots, u_n)$, a corresponding lower triangular n×n rate allocation matrix T is defined, along with auxiliary variables the algorithm that follows:

$$t_{i,j} \triangleq \sum_{k=j}^{i} T_{k,j}, \; d_{i,j} \triangleq \sum_{k=1}^{j} (m_k - m_{k-1}) T_{i,k}, \text{ and } s_i$$

---

Algorithm 1

$$T_{1,1} = \frac{u_1}{m_1 - z}, \; t_{1,1} = \frac{u_1}{m_1 - z}, \; d_{1,1} = \frac{m_1 u_1}{m_1 - z}, \; s_1 = 0,$$

$$m_0 = 0$$

for i = 2 → n do
  {allocation for sink i on links $l_{m_{j-1}+1}, \ldots, l_{m_j}$}
  $d_{i,0} = 0$
  j = 1 while $1 - t_{i-1,j} < \frac{u_i - d_{i,j-1}}{m_i - m_{j-1} - z}$ do $T_{i,j} = 1 - t_{i-1,j}$
    $t_{i,j} = \sum_{k=j}^{i} T_{k,j}$
    $d_{i,j} = \sum_{k=1}^{j}(m_k - m_{k-1})T_{i,k}$
    j ← j + 1
    if j > i or $u_i \le d_{i,j}$ then
      return error {rate vector is unallocable}
    end if
  end while
  $s_i = j - 1$ {the uniform portion follows}
  while j ≤ i do $$T_{i,j} = \frac{u_i - d_{i,s_i}}{m_i - m_{s_i} - z}$$

$t_{i,j} = \sum_{k=j}^{i} T_{k,j}$
    $d_{i,j} = \sum_{k=1}^{j}(m_k - m_{k-1})T_{i,k}$
    j ← j + 1
  end while
end for Note that $T_{i,s_i} < T_{i,s_i+1} = T_{i,s_i+2} = \ldots = T_{i,i}$.

Sliding Window Erasure Model

Erasure Model

In this section, a new erasure model to characterize a class of possible erased subsets of I, the middle layer of a given 3-layer nested network is considered. This model bounds the long-term erasure rate and constrains the burstiness of erasures which the code is designed to correct.

Appendix B sets forth the definitions and proof that the optimization and coding scheme described above may be utilized for a variety of erasure models including a sliding window erasure model in accordance with one or more embodiments of the invention.

Logical Flow

Figure 4:
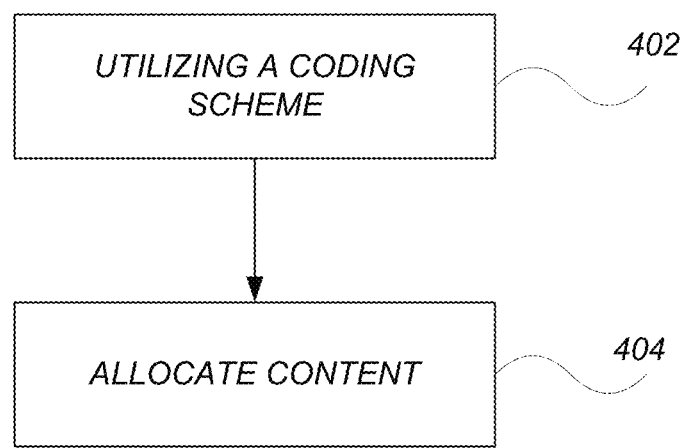
FIG. 4 illustrates the logical flow for error correction coding for a non-multicast nested receiver structure in accordance with one or more embodiments of the invention.

FIG. 4 illustrates the logical flow for error correction coding for streaming communication in accordance with one or more embodiments of the invention.

At step 402, a coding scheme is utilized. Such a coding scheme is defined in terms of a non-multicast network problem with a nested receiver structure, wherein each packet in the streaming problem corresponds to a link in the non-multicast network problem and each deadline in the streaming problem corresponds to a receiver in the non-multicast network problem. Each of the multiple receivers is required to decode specific messages $\{M_1, M_2, \ldots M_n\}$, from the content of received packets, at given time steps $\{m_1, m_2, \ldots m_n\}$ respectively. Further, each of the multiple receivers has access to a subset of the content received by another receiver.

At step 404, the content is allocated into the multiple packets. Such transmission may be performed in a non-multicast manner including via streaming to one or more of the receivers. As described above, no coding occurs across information demanded by different receivers and a capacity region defines a set of information rate vectors $(u_1, u_2, \ldots, u_n)$, that can be communicated to the multiple receivers successfully. In this regard, a rate vector $(u_1, u_2, \ldots, u_n)$ is successfully communicated if the sum of the amounts $(y_i^j)$ of the information corresponding to a message $M_j$ transmitted on unerased links $l_i$, is greater than or equal to $u_j$ per:

$$\forall j: 1 \leq j \leq n \; u_j \leq \sum_{i \in P \cap \{1, \ldots, m_i\}} y_i^j;$$

and the sum of $y_i^j$ for $1 \leq j \leq n$ is less than or equal to 1 per:

$$\forall i: 1 \leq i \leq m_n \; \sum_{j=1}^{n} y_i^j \leq 1.$$

A code for the uniform erasure model ensures that the sums are satisfied for every unerased set of packets P where $|P| \geq m_n - z$.

As described above, an "As Uniform As Possible" coding scheme may also be utilized. In such a coding scheme, for a given rate vector $(u_1, u_2, \ldots, u_n)$, a matrix and variables may be defined. The matrix consists of a triangular n×n rate allocation matrix T that is used to assign rates for each successive receiver. Alternatively, instead of a matrix, T may be a vector. The auxiliary variables are $$t_{i,j} \triangleq \sum_{k=j}^{i} T_{k,j}, \; d_{i,j} \triangleq \sum_{k=1}^{j} (m_k - m_{k-1}) T_{i,k},$$

and $s_i$, wherein $t_i$ comprises a receiver node.

The matrix/vector may be defined by the method set forth in algorithm 1 described above and by setting $y_i^j = T_{j,k} \; \forall i$: $m_{k-1} < i \leq m_k$. Such a methodology may assign rates in the matrix based on the following: In such a matrix, the (i,j)th entry corresponds to $y_i^j$ and is defined. Each row corresponds to a demanded subset of source packets. Each column corresponds to given time steps $\{m_1, m_2, \ldots m_n\}$. Each row is processed by assigning a rate comprising the rate vector (u) divided by a difference between the given time steps (m) and number of packet erasures (z):

$$\frac{u_i}{m_j - z},$$

When assigning a rate to a specific cell in a specific row and specific column, if a sum of all assigned rates in the specific column exceeds capacity, a rate that brings the sum equal to or below the capacity is assigned to the specific cell and rates for remaining cells in the specific row are assigned based on remaining available capacity.

In addition to the above, a variety of erasure models may be utilized (e.g., a uniform erasure model, a sliding window erasure model, or any other erasure model) to characterize a class of possible erased subsets of the content. However, embodiments of the invention are not limited to the erasure models described herein.

Further to the above, for an arbitrary erasure model, linear programming may be applied subject to the constraints/inequalities described above for any arbitrary erasure model (e.g., having an arbitrary set of erasure patterns).

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

[1] N. Cai and R. W. Yeung, "Network coding and error correction," in ITW2002 Bangalore, 2002.

[2] R. W. Yeung and N. Cai, "Network error correction, part I: Basic concepts and upper bounds," Commun. Inf. Syst., vol. 6, no. 1, pp. 19-36, 2006.

[3] N. Cai and R. W. Yeung, "Network error correction, part II: Lower bounds," Commun. Inf. Syst., vol. 6, no. 1, pp. 37-54, 2006.

[4] A. F. Dana, R. Gowaikar, R. Palanki, B. Hassibi, and M. Effros, "Capacity of wireless erasure networks," IEEE Transactions on Information Theory, vol. 52, pp. 789-804, 2006.

[5] R. K. D. S. Lun, M. Medard and M. Effros, "On coding for reliable communication over packet networks," Physical Communication, vol. 1, no. 5, March 2008.

[6] S. Jaggi, M. Langberg, S. Katti, T. Ho, D. Katabi, M. M edard, and M. Effros, "Resilient network coding in the presence of byzantine adversaries," Information Theory, IEEE Transactions on, vol. 54, no. 6, pp. 2596-2603, June 2008.

[7] R. Koetterand F. R. Kschischang, "Coding for errors and erasures in random network coding," IEEE Transactions on Information Theory, August 2008.

[8] D. Silva, F. Kschischang, and R. Kotter, "A rank-metric approach to error control in random network coding," IEEE Transactions on Information Theory, vol. 54, no. 9, pp. 3951-3967, September 2008.

[9] E. Erez and M. Feder, "Capacity region and network codes for two receivers multicast with private and common data," in Proc. IEEE International Symposium on Information Theory, 2003.

[10] C. Ngai and R. Yeung, "Multisource network coding with two sinks," in Communications, Circuits and Systems, 2004. ICCCAS 2004. 2004 International Conference on, vol. 1, June 2004, pp. 34-37.

[11] A. Ramamoorthy and R. D. Wesel, "The single source two terminal network with network coding," in Canadian Workshop on Information Theory, 2005.

[12] R. Koetter and M. M edard, "An algebraic approach to network coding," IEEE/ACM Transactions on Networking, vol. 11, no. 5, pp. 782-795, October 2003.

[13] T. Chan and A. Grant, "Mission impossible: Computing the network coding capacity region," in Proc. IEEE International Symposium on Information Theory, July 2008, pp. 320-324.

[14] N. Harvey and R. Kleinberg, "Tighter cut-based bounds for k-pairs communication problems," in Proc. 43rd Allerton Conference on Communication, Control, and Computing, Monticello, Ill., September 2005.

[15] S. Vyetrenko, T. Ho, and T. Dikaliotis, "Outer bounds on the error correction capacity region for non-multicast networks," in Allerton conference on Communication, Control, and Computing, September 2010.

[16] E. Martinian and C.-E. Sundberg, "Burst erasure correction codes with low decoding delay," IEEE Trans. Inf. Theory, vol. 50, no. 10, pp. 2494-2502, October 2005.

[17] E. Martinian and M. Trott, "Delay-optimal burst erasure code construction," in ISIT, July 2007.

[18] S. Vyetrenko, T. Ho, M. Effros, J. Kliewer, and E. Erez, "Rate regions for coherent and noncoherent multi-source network error correction," in Proc. IEEE International Symposium on Information Theory, June 2009, pp. 1001-1005.

APPENDIX A

Definition 1. *A rate vector $(u_1, u_2, ..., u_n)$ is called allocable if Algorithm 1 does not return any error and the corresponding allocation matrix $T$ is non-negative.*

Definition 2. *Given an allocable rate vector $(u_1, u_2, ..., u_n)$, the "as uniform as possible" intra-session coding scheme is defined by the allocation*

$$y_i^j = T_{j,k} \quad \forall i : m_{k-1} < i \leq m_k. \tag{3}$$

As an example, for $z = 2$ and the inputs $$(m_1, m_2, m_3, m_4) = (10, 14, 18, 22),$$
$$(u_1, u_2, u_3, u_4) = (6, 3, 3, 4),$$

Algorithm 1 will produce:

$$T_{1,1} = t_{1,1} = \frac{u_1}{m_1 - z} = 0.75,$$
$$d_{1,1} = \frac{m_1 u_1}{m_1 - z} = 7.5, s_1 = 0,$$
$$T_{2,1} = \min(1 - t_{1,1}, \frac{u_2}{m_2 - z}) = 0.25,$$
$$t_{2,1} = T_{1,1} + T_{2,1} = 1, d_{2,1} = m_1 T_{2,1} = 2.5.$$

As $\frac{u_2}{m_2-z} \leq 1 - t_{1,1}$, we have:

$$s_2 = 1, T_{2,2} = \frac{u_2 - d_{2,s_2}}{m_2 - m_{s_2} - z} = 0.25,$$
$$t_{2,2} = 0.25, d_{2,2} = m_1 T_{2,1} + (m_2 - m_1) T_{2,2} = 3.5.$$

Since $1 - t_{2,1} = 0$, we get: $T_{3,1} = 0, t_{3,1} = 1, d_{3,1} = 0$.
As $\frac{u_3 - d_{3,1}}{m_3 - m_{s_3} - z} \leq 1 - t_{3,2}$, we have:

$$s_3 = 1, T_{3,2} = T_{3,3} = \frac{u_3 - d_{3,s_2}}{m_3 - m_{s_2} - z} = 0.5,$$
$$t_{3,2} = 0.75, t_{3,3} = 0.5, d_{3,2} = 2, d_{3,3} = 4.$$

Proceeding similarly, we obtain:

$$T = \begin{bmatrix} 0.75 & 0 & 0 & 0 \\ 0.25 & 0.25 & 0 & 0 \\ 0 & 0.5 & 0.5 & 0 \\ 0 & 0.25 & 0.5 & 0.5 \end{bmatrix}.$$

Lemma 1. *If $(u_1, u_2, ..., u_n)$ is allocable, then the corresponding allocation matrix $T$ satisfies:*

$$T_{i,j} \leq T_{i,j+1} \quad \forall i, j : 1 \leq i \leq n, 1 \leq j < i.$$

*Proof:* Let's prove the following statements simultaneously by induction:

$$T_{i,j} \leq T_{i,j+1} \quad \forall i, j : 1 \leq i \leq n, 1 \leq j < i.$$
$$t_{i,j} \geq t_{i,j+1} \quad \forall i, j : 1 \leq i \leq n, 1 \leq j < i.$$

The statements hold trivially for $(i, j) = (1, 1)$. Let the statements hold for all $(i, j)$ before $(k, l)$ in lexicographical order. For $(i, j) = (k, l)$:

Case(1): $l < s_k$:
By construction, we have:

$$T_{k,l} = 1 - t_{k-1,l}, T_{k,l+1} = 1 - t_{k-1,l+1}.$$
$$t_{k,l} = t_{k,l+1} = 1.$$

Clearly, $t_{k,l} \leq t_{k,l+1}$. By induction hypothesis, we have $t_{k-1,l} \geq t_{k-1,l+1}$. Hence $$T_{k,l} = 1 - t_{k-1,l} \leq 1 - t_{k-1,l+1} = T_{k,l+1}.$$

Case(2): $l = s_k$:
By construction, we have:

$$T_{k,l} = 1 - t_{k-1,l} < \frac{u_k - d_{k,l-1}}{m_k - m_{l-1} - z}, \quad (4)$$

$$T_{k,l+1} = \frac{u_k - d_{k,l}}{m_k - m_l - z} \leq 1 - t_{k-1,l+1}. \quad (5)$$

Hence, $$t_{k,l} = t_{k-1,l} + T_{k,l} = 1 \geq t_{k-1,l+1} + T_{k,l+1} = t_{k,l+1}.$$

From (5) we get:

$$T_{k,l+1} = \frac{u_k - d_{k,l}}{m_k - m_l - z}$$
$$= \frac{u_k - d_{k,l-1} - (m_l - m_{l-1}) T_{k,l}}{m_k - m_l - z}. \quad (6)$$

Using (4) we obtain:

$$T_{k,l}(m_k - m_{l-1} - z) < u_k - d_{k,l-1}. \quad (7)$$

Combining (6) and (7) we get:

$$T_{k,l+1} > T_{k,l}.$$

Case(3): $l > s_k$:
By construction, we have:

$$T_{k,l} = T_{k,l+1}.$$
$$t_{k,l} = T_{k,l} + t_{k-1,l}, t_{k,l+1} = T_{k,l+1} + t_{k-1,l+1}.$$

By induction hypothesis, $t_{k-1,l} \geq t_{k-1,l+1}$. Hence, $$t_{k,l} \geq t_{k,l+1}.$$

■

Lemma 2. *Given an allocable rate vector $(u_1, u_2, ..., u_n)$, the "as uniform as possible" intra-session coding scheme achieves the rate vector $(u_1, u_2, ..., u_n)$.*

*Proof:* Let's verify that the allocation $y_i^j$ in (3) satisfies (1) and (2) for every set of unerased links $P \subseteq \mathcal{I}$ with $|P| \geq m_n - z$.
From Lemma 1 we have:

$$y_i^j \leq y_{i+1}^j \quad \forall i, j : 1 \leq i < m_n, 1 \leq j \leq n,$$

which implies:

$$\sum_{i \in P \cap \{1,...,m_k\}} y_i^j$$
$$\geq \sum_{i=1}^{m_k - z} y_i^j$$
$$= \sum_{i=1}^{s_k} (m_i - m_{i-1}) T_{k,i} + (m_k - m_{s_k} - z) T_{k,s_k+1}$$
$$= d_{k,s_k} + (m_k - m_{s_k} - z) \frac{u_k - d_{k,s_k}}{m_k - m_{s_k} - z} = u_k,$$

which establishes (1).
By construction we have $T_{i,j} \leq 1 - t_{i-1,j}$, i.e. $t_{i,j} \leq 1$.
As $\sum_{j=1}^n y_i^j = t_{n,k}$ for $k : m_{k-1} < i \leq m_k$, we have:

$$\sum_{j=1}^n y_i^j \leq 1,$$

which establishes (2).

■

IV. MAIN RESULT AND PROOF

A. Erasure Correction Capacity

Theorem 1. *The $z$-erasure correction capacity region of $\mathcal{G}_n$ is achieved by the "as uniform as possible" intra-session coding scheme.*

Theorem 1 is proved inductively using the following lemmas. Let $S = \{S_1, S_2, \ldots, S_n\}$ be an arbitrary set. We use the following notation in this section:

$$S^j = \{S_1, S_2, \ldots, S_j\},$$

$$S_i^j = \{S_i, S_{i+1}, \ldots, S_j\}.$$

Lemma 3. *Let $Z$ be the set of random elements transmitted on $\mathcal{I} = \{l_1, l_2, \ldots, l_{m_n}\}$. Let $M = \{M_1, M_2, \ldots, M_n\}$ be a set of random elements, where $M_i$ is demanded by the sink $t_i$. Then,*

$$I(M_{i+1}^n; Z|M_1^i) = H(Z|M_1^i).$$

*Proof:* Since $Z$ is a function of $M_1, \ldots, M_n$, $$I(M_{i+1}^n; Z|M_1^i) = H(Z|M_1^i) - H(Z|M_1^n) = H(Z|M_1^i).$$

∎

Lemma 4. *Let $M = \{M_1, M_2, \ldots, M_n\}$ be a set of random elements, where $M_i$ is demanded by the sink $t_i$. Let $Y$ be the set of random elements transmitted on $\mathcal{I} = \{l_1, l_2, \ldots, l_{m_n}\}$ and achieving the rate vector $(u_1, u_2, \ldots, u_n)$. Then,*

$$H(Y|M_1^{i-1}) = u_i + H(Y|M_1^i).$$

*Proof:* By Lemma 3, $H(Y|M_1^{i-1}) = I(M_i^n; Y|M_1^{i-1})$. Therefore, by the chain rule for mutual information:

$$H(Y|M_1^{i-1}) = I(M_i; Y|M_1^{i-1}) + I(M_{i+1}^n; Y|M_1^i). \quad (8)$$

Consider the first term in expansion (8):

$$I(M_i; Y|M_1^{i-1}) = H(M_i|M_1^{i-1}) - H(M_i|M_1^{i-1}, Y)$$
$$= H(M_i|M_1^{i-1}) = H(M_i) = u_i,$$

which follows from the fact that $Y$ is a decoding set for $M_i$ and independence of $M_1, \ldots, M_n$.

Consider the second term in expansion (8):

$$I(M_{i+1}^n; Y|M_1^i) = H(Y|M_1^i) - H(Y|M_1^n) = H(Y|M_1^i),$$

since $Y$ is a function of $M_1, \ldots, M_n$.

Therefore, $$H(Y|M_1^{i-1}) = u_i + H(Y|M_1^i).$$

∎

Lemma 5. *Let $X = \{X_1, \ldots, X_t\}$, $Z$ and $M$ be sets of random elements and $k \leq t$ be a positive integer. Then,*

$$\sum_{A:|A|=k, A \subset X} H(Z, A|M) \geq \binom{t-1}{k-1} H(Z, X|M).$$

*Proof:* Consider a subset $A = \{X_{i_1}, X_{i_2}, \ldots, X_{i_k}\}$ of $X$ where $i_1 < i_2 < \ldots < i_k$. Let $A^m = \{X_{i_1}, X_{i_2}, \ldots, X_{i_m}\}$. By the chain rule for conditional entropy:

$$H(Z, A|M) = H(Z|M) + \sum_{j=1}^{j=k} H(X_{i_j}|M, Z, A^{j-1}). \quad (9)$$

As conditioning decreases entropy, we have $$H(X_{i_j}|M, Z, A^{j-1}) \geq H(X_{i_j}|M, Z, X^{i_j-1}). \quad (10)$$

Summing (9) for all choices of $A$ and applying (10) we get:

$$\sum_{A:|A|=k, A \subset X} H(Z, A|M)$$

$$\geq \binom{t}{k} H(Z|M) + \binom{t-1}{k-1} \sum_{j=1}^{t} H(X_j|M, Z, X^{j-1})$$

$$\geq \binom{t-1}{k-1} H(Z|M) + \binom{t-1}{k-1} \sum_{j=1}^{t} H(X_j|M, Z, X^{j-1})$$

$$= \binom{t-1}{k-1} H(Z, X|M).$$

∎

Let $T$ be the allocation matrix corresponding to an allocable rate vector $(u_1, u_2, \ldots, u_n)$. Define integers $r_i$ by:

$$0 = T_{i,1} = T_{i,2} = \ldots = T_{i,r_i} < T_{i,r_i+1}.$$

Lemma 6. *Let $(u_1, u_2, \ldots, u_n)$ be a rate vector attained by the "as uniform as possible" intra-session coding. Let $T$ and $t$ be the corresponding $n \times n$ lower triangular matrices. Let $X = \{X_1, X_2, \ldots, X_{m_n}\}$ where $X_i$ is the random element transmitted on the link $l_i$. Assume that $X$ attains the rate vector $(u_1, u_2, \ldots, u_n)$ and that any set of unerased packets $Y = Y_1 \cup Y_2 \cup \ldots \cup Y_{n-1} \subset X^{m_{n-1}}$ with $|Y| \geq m_{n-1} - z$ and satisfying*

$$\left. \begin{array}{l} Y_i = \{X_{m_{i-1}+1}, \ldots, X_{m_i}\} \, \forall i : 0 < i \leq s_{n-1}, \\ Y_i \subset \{X_{m_{i-1}+1}, \ldots, X_{m_i}\} \, \forall i : s_{n-1} < i \leq n-1, \end{array} \right\} \quad (11)$$

*also satisfies*

$$H(Y|M_1^{n-1}) \leq \sum_{i=s_{n-1}+1}^{n-1} |Y_i|(1-t_{n-1,i}).$$

*Then, for any set of unerased packets $W = W_1 \cup W_2 \cup \ldots \cup W_n \subset X^{m_n}$ with $|W| \geq m_n - z$ and satisfying*

$$W_i = \{X_{m_{i-1}+1}, \ldots, X_{m_i}\} \quad \forall i : 0 < i \leq s_n,$$
$$W_i \subset \{X_{m_{i-1}+1}, \ldots, X_{m_i}\} \quad \forall i : s_n < i \leq n,$$

*we have:*

$$H(W|M_1^n) \leq \sum_{i=s_n+1}^{n} |W_i|(1-t_{n,i}).$$

*Proof:* Let's first prove that $m_n - m_{s_n} - z > 0$. If $s_n = 0$, since we have more than $z$ links in $\mathcal{I}$, $m_n - m_{s_n} - z > 0$. If $s_n \geq 1$, by construction of $s_n$ we have:

$$u_n - d_{n,s_n} > 0.$$

As $T$ is non-negative, $$0 \leq T_{n,s_n+1} = \frac{u_n - d_{n,s_n}}{m_n - m_{s_n} - z}.$$

Hence $m_n - m_{s_n} - z > 0$, as desired.
By construction of $T_{i,j}$ we have:

$$u_n = \sum_{i=r_n+1}^{s_n} (m_i - m_{i-1})T_{n,i} + (m_n - m_s - z)T_{n,n}. \quad (12)$$

Let $V = V_1 \cup V_2 \cup \ldots \cup V_n$ with $|V| = m_n - z$ be a set of unerased packets satisfying $$V_i = \{X_{m_{i-1}+1}, \ldots, X_{m_i}\} \quad \forall i : 0 < i \leq s_n,$$
$$V_i \subset \{X_{m_{i-1}+1}, \ldots, X_{m_i}\} \quad \forall i : s_n < i \leq n.$$

By Lemma 4, we have: $H(V|M_1^n) = H(V|M_1^{n-1}) - u_n$. We also have:

$$H(V|M_1^{n-1}) \leq |V_n| + H(V_1^{n-1}|M_1^{n-1}).$$

As $V' = V_1 \cup V_2 \cup \ldots \cup V_{n-1}$ satisfies (11), by assumption we have:

$$H(V'|M_1^{n-1}) \leq \sum_{i=s_{n-1}+1}^{n-1} |V_i|(1-t_{n-1,i}). \quad (13)$$

As $|V_i| = m_i - m_{i-1} \quad \forall i : 1 \leq i \leq s_n$, $s_{n-1}+1 \leq r_n$, $t_{n-1,i} = 1 \quad \forall i : 1 \leq i \leq r_n$, and $T_{n,i} = 1 - t_{n-1,i} \quad \forall i : 1 \leq i \leq s_n$, we can rewrite (13) as:

$$H(V|M_1^{n-1}) \leq \sum_{i=r_n+1}^{s_n} (m_i - m_{i-1})T_{n,i}$$
$$+ \sum_{i=s_n+1}^{n-1} |V_i|(1-t_{n-1,i}).$$

Hence we have:

$$H(V|M_1^n) \leq \sum_{i=r_n+1}^{s_n} (m_i - m_{i-1})T_{n,i}$$
$$+ \sum_{i=s_n+1}^{n-1} |V_i|(1-t_{n-1,i}) + |V_n| - u_n.$$

Using (12) we get:

$$H(V|M_1^n) \leq \sum_{i=s_n+1}^{n} |V_i|(1-t_{n-1,i} - T_{n,i})$$
$$= \sum_{i=s_n+1}^{n} |V_i|(1-t_{n-1,i} - T_{n,i})$$
$$= \sum_{i=s_n+1}^{n} |V_i|(1-t_{n,i}). \quad (14)$$

Let $z' \leq z$ and $W = W_1 \cup W_2 \cup \ldots \cup W_n$ be a set of unerased packets satisfying $$|W| = m_n - z',$$
$$W_i = \{X_{m_{i-1}+1}, \ldots, X_{m_i}\} \quad \forall i : 0 < i \leq s_n,$$
$$W_i \subset \{X_{m_{i-1}+1}, \ldots, X_{m_i}\} \quad \forall i : s_n < i \leq n.$$

From (14), for any $V = V_1 \cup V_2 \cup \ldots \cup V_n \subset W$ with $|V| = m_n - z$ and satisfying $$V_i = \{X_{m_{i-1}+1}, \ldots, X_{m_i}\} \quad \forall i : 0 < i \leq s_n,$$
$$V_i \subset \{X_{m_{i-1}+1}, \ldots, X_{m_i}\} \quad \forall i : s_n < i \leq n,$$

we have:

$$H(V|M_1^n) \leq \sum_{i=s_n+1}^{n} |V_i|(1-t_{n,i}).$$

Summing the last inequality for all possible $V$ and applying Lemma 5 for $Z = \{W_1, W_2, \ldots, W_{s_n}\}$, $X = \{W_{s_n+1}, W_{s_n+2}, \ldots, W_n\}$, $M = \{M_1, M_2, \ldots, M_n\}$ and $k = m_n - m_{s_n} - z$ we get:

$$\binom{m_n - m_{s_n} - z' - 1}{m_n - m_{s_n} - z - 1} H(W|M_1^n) \leq$$
$$\binom{m_n - m_{s_n} - z' - 1}{m_n - m_{s_n} - z - 1} \sum_{i=s_n+1}^{n} |W_i|(1-t_{n,i}). \quad (15)$$

where the constant on the RHS comes from the fact that any $X_j \in W_i$ with $i \in \{s_n+1, \ldots, n\}$ appears in exactly $\binom{m_n - m_{s_n} - z' - 1}{m_n - m_{s_n} - z - 1}$ different $V$. The result follows by simplifying (15). ∎

*Proof of Theorem 1:* Let rate vector $(u_1, u_2, \ldots, u_n)$ be attained with $X = \{X_1, X_2, \ldots, X_{m_n}\}$. We will prove by induction that the following conditions are satisfied for each $k \in \{1, \ldots, n-1\}$:

(i) $(u_1, u_2, \ldots, u_{k+1})$ is attained by the "as uniform as possible" intra-session coding.

(ii) Any set of unerased packets $Y = Y_1 \cup Y_2 \cup \ldots \cup Y_k \subset X^{m_k}$ with $|Y| \geq m_k - z$ and satisfying $$Y_i = \{X_{m_{i-1}+1}, \ldots, X_{m_i}\} \quad \forall i : 0 < i \leq s_k,$$

$$Y_i \subset \{X_{m_{i-1}+1}, \ldots, X_{m_i}\} \quad \forall i : s_k < i \leq k,$$

also satisfies $$H(Y|M_1^k) \leq \sum_{i=s_k+1}^{k} |Y_i|(1 - t_{k,i}),$$

where $s_k$ is defined as in Algorithm 1 using the rate vector $(u_1, u_2, \ldots, u_k)$.

*Proof of (ii) when k=1:* We have $r_1 = s_1 = 0$, $t_{1,1} = T_{1,1} = \frac{u_1}{m_1 - z}$. Hence it suffices to show that for any set of unerased packets $Y \subset X^{m_1}$ with $|Y| \geq m_1 - z$:

$$H(Y|M_1) \leq |Y|(1 - \frac{u_1}{m_1 - z}).$$

Let $A \subset X^{m_1}$ be a set of unerased packets with $|A| = m_1 - z$. As $A$ is a decoding set for $M_1$ with rate $u_1$, $$H(A|M_1) \leq H(A) - u_1 = m_1 - z - u_1. \quad (16)$$

Let $z' \leq z$ and $Y \subset X^{m_1}$ be a set of unerased packets with $|Y| = m_1 - z'$. Summing (16) for all possible $A \subset Y$ with $|A| = m_1 - z$ and applying Lemma 5 for $Z = \emptyset$, $X = Y$, $M = M_1$ and $k = m_1 - z$ we get:

$$\binom{m_1 - z' - 1}{m_1 - z - 1} H(Y|M_1) \leq \binom{m_1 - z'}{m_1 - z}(m_1 - z - u_1),$$

which is equivalent to $$H(Y|M_1) \leq \frac{m_1 - z'}{m_1 - z}(m_1 - z - u_1) = |Y|(1 - \frac{u_1}{m_1 - z}).$$

*Proof of (i) when k=1:* Case(1): $m_2 - m_1 \geq z$.
Let $A = \{X_1, X_2, \ldots, X_{m_2-z}\}$. As $A$ is an information set for $M_2$ with rate $u_2$, we have:

$$H(A|M_1, M_2) \leq H(A|M_1) - u_2$$
$$\leq H(X^{m_1}|M_1) + H(A - X^{m_1}|M_1) - u_2. \quad (17)$$

As $H(A - X^{m_1}|M_1) \leq H(A - X^{m_1}) \leq |A - X^{m_1}| = m_2 - m_1 - z$ and $H(X^{m_1}|M_1) \leq |X^{m_1}|(1 - \frac{u_1}{m_1 - z}) = m_1(1 - \frac{u_1}{m_1 - z})$, $$H(A|M_1, M_2) \leq m_1(1 - \frac{u_1}{m_1 - z}) + m_2 - m_1 - z - u_2. \quad (18)$$

As $H(A|M_1, M_2) \geq 0$, (18) implies:

$$u_2 \leq m_1(1 - \frac{u_1}{m_1 - z}) + m_2 - m_1 - z.$$

The $y_i^j$ allocation defined in (3) corresponding to the lower triangular matrix $U$, where $U_{1,1} = \frac{u_1}{m_1 - z}$, $U_{2,1} = 1 - \frac{u_1}{m_1 - z}$, $U_{2,2} = 1$, achieves the rate vector $(u_1, m_1(1 - \frac{u_1}{m_1 - z}) + m_2 - m_1 - z)$, hence $(u_1, u_2)$ is attained by the "as uniform as possible" intra-session coding.

Case(2): $m_2 - m_1 < z$.
Let $A = \{X_1, X_2, \ldots, X_{m_2-z}\}$. As $A$ is an information set for $M_2$ with rate $u_2$, we have:

$$H(A|M_1, M_2) \leq H(A|M_1) - u_2.$$

As $H(A|M_1) \leq |A|(1 - \frac{u_1}{m_1 - z}) = (m_2 - z)(1 - \frac{u_1}{m_1 - z})$, we have, $$H(A|M_1, M_2) \leq (m_2 - z)(1 - \frac{u_1}{m_1 - z}) - u_2. \quad (19)$$

As $H(A|M_1, M_2) \geq 0$, (19) implies:

$$u_2 \leq (m_2 - z)(1 - \frac{u_1}{m_1 - z}).$$

The $y_i^j$ allocation defined in (3) corresponding to the lower triangular matrix $U$ where $U_{1,1} = \frac{u_1}{m_1 - z}$, $U_{2,1} = 1 - \frac{u_1}{m_1 - z}$, $U_{2,2} = 1$ achieves the rate vector $(u_1, (m_2 - z)(1 - \frac{u_1}{m_1 - z}))$. Hence, $(u_1, u_2)$ is attained by the "as uniform as possible" intra-session coding.

Now assume that (i) and (ii) are true for $k = l < n - 1$.

*Proof of (ii) when k=l+1:* As (i) and (ii) are true for $k = l$, we can apply Lemma 6 for $n = l+1$, $X = X^{m_{l+1}}$, from which it follows that for any set of unerased packets $Y = Y_1 \cup Y_2 \cup \ldots \cup Y_{l+1}$ with $|Y| \geq m_{l+1} - z$ and satisfying $$Y_i = \{X_{m_{i-1}+1}, \ldots, X_{m_i}\} \quad \forall i : 0 < i \leq s_{l+1},$$

$$Y_i \subset \{X_{m_{i-1}+1}, \ldots, X_{m_i}\} \quad \forall i : s_{l+1} < i \leq l+1$$

also satisfies:

$$H(Y|M_1^{l+1}) \leq \sum_{i=s_{l+1}+1}^{l+1} |Y_i|(1 - t_{l+1,i}).$$

*Proof of (i) when k=l+1:* Case(1): $m_{l+2} - m_{l+1} \geq z$.
Let $A = \{X_1, X_2, \ldots, X_{m_{l+2}-z}\}$. As $A$ is an information set for $M_{l+2}$ with rate $u_{l+2}$, we have:

$$H(A|M_1^{l+2}) \leq H(A|M_1^{l+1}) - u_{l+2}$$
$$\leq H(X^{m_{l+1}}|M_1^{l+1}) + H(A - X^{m_{l+1}}|M_1^{l+1}) - u_{l+2}. \quad (20)$$

$$H(A - X^{m_{i+1}} | M_1^{l+1}) \leq H(A - X^{m_{i+1}}) \leq |A - X^{m_{i+1}}|$$
$$= m_{l+2} - m_{i+1} - z. \quad (21)$$

As (ii) is true for $k = l - 1$ and $Y = X_1^{m_{i+1}}$:

$$H(X^{m_{i+1}} | M_1^{l+1}) \leq \sum_{i=s_{i+1}+1}^{l+1} (m_i - m_{i-1})(1 - t_{l+1,i}) \quad (22)$$

Combining (20), (21), and (22) we have:

$$H(A | M_1^{l+2}) \leq \sum_{i=s_{i+1}+1}^{l+1} (m_i - m_{i-1})(1 - t_{l+1,i}) + m_{l+2} - m_{i+1} - z - u_{l+2}. \quad (23)$$

As $H(A | M_1^{l+2}) \geq 0$, (23) implies:

$$u_{l+2} \leq \sum_{i=s_{i+1}+1}^{l+1} (m_i - m_{i-1})(1 - t_{l+1,i}) + m_{l+2} - m_{i+1} - z$$

Let's define an allocation matrix $U$ as follows: the first $l+1$ rows of $U$ are the same as that of the matrix $T$ corresponding to the rate vector $(u_1, u_2, \ldots, u_{l+1})$ and $U_{l+2,i} = 1 - t_{l+1,i}$ for $1 \leq i \leq l+2$. The $y_j^i$ allocation defined in (3) corresponding to the lower triangular matrix $U$ achieves the rate vector $(u_1, u_2, \ldots, u_{l+1}, \sum_{i=s_{i+1}+1}^{l+1}(m_i - m_{i-1})(1 - t_{l+1,i}) + m_{l+2} - m_{i+1} - z)$. Hence $(u_1, u_2, \ldots, u_{l+2})$ is attained by the "as uniform as possible" intra-session coding.

Case(2): $m_{l+2} - m_{i+1} < z$.

Let $j$ be the integer satisfying $m_j < m_{l+2} - z \leq m_{j+1}$. Let $A = \{X_1, X_2, \ldots, X_{m_{l+2}-z}\}$. As $A$ is an information set for $M_{l+2}$ with rate $u_{l+2}$, we have:

$$H(A | M_1^{l+2}) \leq H(A | M_1^{l+1}) - u_{l+2}. \quad (24)$$

As (ii) is true for $k = l - 1$ and $Y = A$:

$$H(A | M_1^{l+1}) \leq \sum_{i=s_{i+1}+1}^{l+2} |A \cap X_{m_{i-1}+1}^{m_i}|(1 - t_{l+1,i})$$
$$= \sum_{i=s_{i+1}+1}^{j} (m_i - m_{i-1})(1 - t_{l+1,i}) + (m_{l+2} - m_j - z)(1 - t_{l+1,j+1}). \quad (25)$$

Combining (24) and (25) we get:

$$H(A | M_1^{l+2}) \leq \sum_{i=s_{i+1}+1}^{j} (m_i - m_{i-1})(1 - t_{l+1,i}) + (m_{l+2} - m_j - z)(1 - t_{l+1,j+1}) - u_{l+2}. \quad (26)$$

As $H(A | M_1^{l+2}) \geq 0$, (26) implies:

$$u_{l+2} \leq \sum_{i=s_{i+1}+1}^{j} (m_i - m_{i-1})(1 - t_{l+1,i}) + (m_{l+2} - m_j - z)(1 - t_{l+1,j+1}).$$

Let's define an allocation matrix $U$ as follows: the first $l+1$ rows of $U$ are the same as that of the matrix $T$ corresponding to the rate vector $(u_1, u_2, \ldots, u_{l+1})$ and $U_{l+2,i} = 1 - t_{l+1,i}$ for $1 \leq i \leq l+2$. The $y_j^i$ allocation defined in (3) corresponding to the lower triangular matrix $U$ achieves the rate vector $(u_1, u_2, \ldots, u_{l+1}, \sum_{i=s_{i+1}+1}^{j}(m_i - m_{i-1})(1 - t_{l+1,i}) + (m_{l+2} - m_j - z)(1 - t_{l+1,j+1}))$, hence $(u_1, u_2, \ldots, u_{l+2})$ is attained by the "as uniform as possible" intra-session coding.

We verified that (i) and (ii) are satisfied for $k \in \{1, \ldots, n-1\}$. In particular, (i) is satisfied for $k = n-1$. Hence, the rate vector $(u_1, u_2, \ldots, u_n)$ is attained by the "as uniform as possible" intra-session coding. ∎

B. Error Correction Capacity

Here we consider the $z$-error correction capacity region of 3-layer nested-networks. The following result is shown in [18].[1]

Lemma 7. *Let a linear network code $C$ on an acyclic network be given. For a sink node $t$, the following properties of $C$ are equivalent:*
*1) any error pattern with at most $z$ errors can be corrected at $t$;*
*2) any erasure pattern with at most $2z$ link failures can be corrected at $t$.*

Lemma 8. *Let a (possibly nonlinear) network code $C$ on network $\mathcal{G}_n$ be given. Assume that any error pattern with at most $z$ errors on $\mathcal{I}$ (the set of links in the middle layer of $\mathcal{G}_n$) can be corrected at sink $t_i$. Then, any $2z$ erasures on $\mathcal{I}$ can be corrected at sink $t_i$.*

*Proof:* By a Singleton-type argument, if two codewords agree on $m_s - 2z$ links, then there exist corresponding patterns of $z$ errors on the remaining links such that $t_i$ is unable to distinguish between the two codewords. Hence, any set of $m_s - 2z$ links is an

---

[1] The proof in [18] is formally written for scalar linear codes, but easily extends to vector linear codes of vector length $y$ by considering each link as $y$ parallel sublinks and defining the network Hamming weight of a received vector $v$ in terms of the number of erroneous links (not sublinks) needed to produce $v$.

information set for sink $t_i$, allowing correction of any $2z$ erasures. ∎

Theorem 2. *The $z$-error correction capacity region of $\mathcal{G}_n$ is the same as the $2z$-erasure correction capacity region of $\mathcal{G}_n$ and is achieved by the "as uniform as possible" intra-session coding for $2z$-erasures.*

*Proof:* By Lemma 8, the $z$-error correction capacity region of $\mathcal{G}_n$ is no greater than the $2z$-erasure correction capacity region of $\mathcal{G}_n$. Since the "as uniform as possible" intra-session coding for $2z$-erasures is a linear code, achievability follows from Lemma 7. ∎

C. Example

Consider an example with three receivers, parameters $m_1 = 5$, $m_2 = 8$, and $m_3 = 12$, and at most two erasures (or one error). Let $(u_1, u_2, u_3)$ be an achievable rate vector. There are two cases:

Case(1): $T_{1,1} = \frac{u_1}{3}, T_{2,1} = T_{2,2} = \frac{u_2}{6}$. As $T_{1,1} \leq 1$ we have $u_1 \leq 3$. We also have: $T_{3,1} \leq 1 - \frac{u_1}{3} - \frac{u_2}{6}, T_{3,2} \leq 1 - \frac{u_2}{6}, T_{3,3} \leq 1$. Hence $u_3 \leq 2 + 3(1 - \frac{u_2}{6}) + 5(1 - \frac{u_1}{3} - \frac{u_2}{6})$, which is equivalent to: $5u_1 + 4u_2 + 3u_3 \leq 30$.

Case(2): $T_{1,1} = \frac{u_1}{3}, T_{2,1} = 1 - \frac{u_1}{3}, T_{2,2} = u_2 - 5(1 - \frac{u_1}{3})$. As $T_{2,2} \leq 1$ we have $u_2 \leq 1 + 5(1 - \frac{u_1}{3})$, which is equivalent to: $u_1 + 3u_2 \leq 18$. We also have: $T_{3,1} = 0, T_{3,2} \leq 6 - u_2 - \frac{5u_1}{3}, T_{3,3} \leq 1$. Hence $u_3 \leq 2 + 3(6 - u_2 - \frac{5u_1}{3})$, which is equivalent to: $5u_1 + 3u_2 + u_3 \leq 20$.

Hence the capacity region is given by $$u_1 \leq 3, u_1 + 3u_2 \leq 18,$$
$$5u_1 + 4u_2 + 3u_3 \leq 30,$$
$$5u_1 + 3u_2 + u_3 \leq 20.$$

APPENDIX B

*Definition 3:* Let $p > 0$ and a threshold $T$ be given. An erasure pattern on the middle layer $\mathcal{I}$ of a 3-layer nested network is called sliding window erasure if for every $t \geq T$, at most $tp$ out of any $t$ consecutive links in $\mathcal{I}$ can be erased.

Note that under a sliding window erasure with parameters $p$ and $T$, erasures occur with a long term rate less than $p$, and the length of the erasure bursts are cotrolled by the threshold $T$. The following definition classifies possible unerased sets under the sliding window erasure model:

*Definition 4:* Let $A = \{a_1, a_2, \ldots, a_n\}$ be an ordered set. A subset $B$ of $A$ is called $(p,T)$-unerased subset of $A$, if the inequality $$|B \cap \{a_{i+1}, a_{i+2}, \ldots, a_{i+t}\}| \geq (1-p)t \qquad (4)$$

is satisfied for all positive integer pairs $(t, i)$ satisfying $t \geq T$, and $0 \leq i \leq n - t$.

B. Main Result

We will verify the effieciency of the "as uniform as possible" intra-session coding that we defined in Section III-B. The following lemma states that under the sliding window erasure, the amount of the information loss is controlled by the parameter $p$ for certain information allocations:

*Lemma 2:* Let $A = \{a_1, a_2, \ldots, a_n\}$ be an ordered set of nonnegative real numbers with $a_1 \geq a_2 \geq \ldots \geq a_n$ and $a_1 = a_2 = \ldots = a_T = a$. Let $\|X\|$ denote the sum of elements in an arbitrary finite set of real numbers $X$. Let $B$ be a $(p,T)$-unerased subset of $A$ under some sliding window erasure with parameters $p$ and $T$. Then, $$\|B\| \geq (1-p)\|A\|.$$

*Proof:* See Section V. ∎

Note that the monotonicity of the numbers $a_i$ is crucial as Lemma 1 states that the amount of the information allocated for a certain message $M_i$ on the middle layer of the network is monotone under the "as uniform as possible" intrasession coding scheme. The following lemma establishes that the equally allocated part of a message has a length of at least $T$ under the "as uniform as possible" intrasession coding for a constant multiple of a vector inside the capacity region of the network under the erasure-free case. Hence, by Lemma 2, the rate of the erased information for a particular message $M_i$ will not be greater than $p$.

*Lemma 3:* Let $V = \{(v_1, v_2, \ldots, v_n) | \sum_{i=1}^{k} v_i \leq m_k \ \forall k : 1 \leq k \leq n\}$. Let $\vec{v} \in V$. The rate vector $\frac{1}{1+\log(\frac{m_1+T}{m_1})}\vec{v}$ is achievable by the "as uniform as possible" intra-session coding, in a such way that the corresponding allocation $q$ satisfies:

$$q^i_{m_i-T+1} = q^i_{m_i-T+2} = \ldots = q^i_{m_i} \quad \forall i : 1 \leq i \leq n. \quad (5)$$

*Proof:* See Section V. ∎

Lemma 4 and Lemma 5 compares the capacity regions of the "as uniform as possible" intrasession coding scheme and any other coding scheme to an intermediate region $V$, which is the capacity region under the erasure-free case.

*Lemma 4:* Let $U$ be the erasure correction capacity region under some sliding window erasure with parameters $p$ and $T$. Let $V = \{(v_1, v_2, \ldots, v_n) | \sum_{i=1}^{k} v_i \leq m_k \ \forall k : 1 \leq k \leq n\}$. Then $$U \subset (1 - p + \frac{1}{T})V. \quad (6)$$

*Proof:* See Section V. ∎

*Lemma 5:* Let $W$ be the erasure correction capacity region obtained by "as uniform as possible" intrasession coding under sliding window erasure with parameters $p$ and $T$. Let $V = \{(v_1, v_2, \ldots, v_n) | \sum_{i=1}^{k} v_i \leq m_k \ \forall k : 1 \leq k \leq n\}$. Then $$(1-p)\frac{1}{1+\log(\frac{m_1+T}{m_1})}V \subset W. \quad (7)$$

*Proof:* See Section V. ∎

The following theorem states that the erasure correction capacity region of the "as uniform as possible" intra-session coding contains a constant multiple of that of any other coding scheme:

*Theorem 1:* Let $U$ be the erasure correction capacity region under sliding window erasure with parameters $p$ and $T$. Let $W$ be the erasure correction capacity region obtained by the "as uniform as possible" intrasession coding under sliding window erasure with parameters $p$ and $T$. Then, $$\frac{1-p}{(1+\log(\frac{m_1+T}{m_1}))(1-p+\frac{1}{T})}U \subset W. \quad (8)$$

*Proof:* Applying Lemma 4 and Lemma 5, we obtain (8). ∎

Let $\lambda = \sup\{x \in \mathbb{R} : xU \subset W\}$. As $\lambda$ is the ratio of the two regions $U$ and $W$, it measures how close the "as uniform as possible" intrasession coding scheme to the optimal coding scheme. Theorem 1 implies that $$\lambda \geq \frac{1-p}{(1+\log(\frac{m_1+T}{m_1}))(1-p+\frac{1}{T})}.$$

Note that for $T \gg 1$, and $m_1 \gg T$ we have $$\frac{1-p}{(1+\log(\frac{m_1+T}{m_1}))(1-p+\frac{1}{T})} \approx 1,$$

which implies that $\lambda \approx 1$ for large values of $T$, and for large values of $m_1$ compared to $T$.

The "as uniform as possible" coding scheme depends only on the network topology and a given rate vector $\vec{v}$. Hence, it does not assume any knowledge of the erasure parameters $p$ and $T$ by the encoder. Therefore, the performance bound found in Theorem 1 will still be valid even though the erasure parameters $p$ and $T$ are altered throughout the data transmission provided that the erasures occur with a sliding window pattern.

V. APPENDIX

*Proof of Lemma 1:* Let's prove the following statements simultaneously by induction:

$$\left.\begin{array}{l} T_{i,j} \leq T_{i,j+1} \quad \forall i,j : 1 \leq i \leq n, 1 \leq j < i, \\ t_{i,j} \geq t_{i,j+1} \quad \forall i,j : 1 \leq i \leq n, 1 \leq j < i. \end{array}\right\} \quad (9)$$

The statements hold trivially for $(i,j) = (1,1)$. Let the statements hold for all $(i,j)$ before $(k,l)$ in lexicographical order. Let's now verify in three cases that (9) is satisfied for $(i,j) = (k,l)$:

Case(1): $l < s_k$:
By construction, we have:

$$T_{k,l} = 1 - t_{k-1,l}, T_{k,l+1} = 1 - t_{k-1,l+1}.$$
$$t_{k,l} = t_{k,l+1} = 1.$$

Clearly, $t_{k,l} \leq t_{k,l+1}$. By induction hypothesis, we have $t_{k-1,l} \geq t_{k-1,l+1}$. Hence $$T_{k,l} = 1 - t_{k-1,l} \leq 1 - t_{k-1,l+1} = T_{k,l+1}.$$

Case(2): $l = s_k$:
By construction, we have:

$$T_{k,l} = 1 - t_{k-1,l} < \frac{u_k - d_{k,l-1}}{m_k - m_{l-1}}, \quad (10)$$

$$T_{k,l+1} = \frac{u_k - d_{k,l}}{m_k - m_l} \leq 1 - t_{k-1,l+1}. \quad (11)$$

Hence, $$t_{k,l} = t_{k-1,l} + T_{k,l} = 1 \geq t_{k-1,l+1} + T_{k,l+1} = t_{k,l+1}.$$

From (11) we get:

$$T_{k,l+1} - \frac{u_k - d_{k,l}}{m_k - m_l}$$
$$= \frac{u_k - d_{k,l-1} - (m_l - m_{l-1})T_{k,l}}{m_k - m_l}. \quad (12)$$

Using (10) we obtain:

$$T_{k,l}(m_l - m_{l-1}) < u_k - d_{k,l-1}. \quad (13)$$

Combining (12) and (13) we get:

$$T_{k,l+1} > T_{k,l}.$$

Case(3): $l > s_k$:
By construction, we have:

$$T_{k,l} = T_{k,l+1},$$
$$t_{k,l} = T_{k,l} + t_{k-1,l}, t_{k,l+1} = T_{k,l+1} + t_{k-1,l+1}.$$

By induction hypothesis, $t_{k-1,l} \geq t_{k-1,l+1}$. Hence, $$t_{k,l} \geq t_{k,l+1}.$$

∎

*Proof of Lemma 2:* Let $B = \{a_{k_1}, a_{k_2}, \ldots, a_{k_m}\}$, where $k_1 < k_2 < \ldots < k_m$. Let $q = 1 - p$. Let $s$ be the largest integer satisfying $k_s \leq T$. Let's prove by induction that $$a_{k_1} + a_{k_2} + \ldots + a_{k_r} \geq q(a_1 + a_2 + \ldots + a_{\lfloor \frac{r}{q} \rfloor})$$
$$+ (r - q\lfloor \frac{r}{q} \rfloor)a_{\lfloor \frac{r}{q} \rfloor+1} \quad (14)$$

is satisfied for any $r$ with $m \geq r \geq s$.
For $r = s$, we have $$\sum_{i=1}^{s} a_{k_i} = sa$$
$$= aq\lfloor \frac{s}{q} \rfloor + (s - q\lfloor \frac{s}{q} \rfloor)a$$
$$\geq q(a_1 + a_2 + \ldots + a_{\lfloor \frac{s}{q} \rfloor}) + (s - q\lfloor \frac{s}{q} \rfloor)a_{\lfloor \frac{s}{q} \rfloor+1}.$$

Let (14) be satisfied for some $r \geq s$. As $k_{r+1} > T$, and $B$ satisfies (4) we have $$r = |B \cap \{a_1, a_2, \ldots, a_{k_{r+1}-1}\}| \geq (1-p)(k_{r+1} - 1)$$
$$= q(k_{r+1} - 1),$$

which is equivalent to $$k_{r+1} \leq 1 + \frac{r}{q}.$$

As $k_{r+1}$ is an integer we have:

$$k_{r+1} \leq 1 + \lfloor \frac{r}{q} \rfloor,$$

which implies $$a_{k_{r+1}} \geq a_{\lfloor \frac{r}{q} \rfloor+1}. \quad (15)$$

As $a_i$ is monotone, using (15) and the induction hypothesis we get $$\sum_{i=1}^{r+1} a_{k_i} \geq q\sum_{i=1}^{\lfloor \frac{r}{q} \rfloor} a_i + (r - q\lfloor \frac{r}{q} \rfloor)a_{\lfloor \frac{r}{q} \rfloor+1} + a_{k_{r+1}}$$
$$= q\sum_{i=1}^{\lfloor \frac{r}{q} \rfloor} a_i + (r + 1 - q\lfloor \frac{r}{q} \rfloor)a_{\lfloor \frac{r}{q} \rfloor+1}$$
$$\geq q\sum_{i=1}^{\lfloor \frac{r+1}{q} \rfloor} a_i + (r + 1 - q\lfloor \frac{r+1}{q} \rfloor)a_{\lfloor \frac{r+1}{q} \rfloor+1},$$

which means that (14) is satisfied for $r + 1$. Hence we established (14).
As $B$ satisfies (4), we have $$m = |B \cap A| \geq (1-p)n = qn,$$

which implies $$n \leq \lfloor \frac{m}{q} \rfloor.$$

As (14) is satisfied for $r = m$, we have $$\|B\| = \sum_{i=1}^{m} a_{k_i} \geq q(a_1 + a_2 + \ldots + a_{\lfloor \frac{m}{q} \rfloor})$$
$$\geq q(a_1 + a_2 + \ldots + a_n)$$
$$= q\|A\| = (1-p)\|A\|,$$

as desired. ∎

*Proof of Lemma 3:* Let $\alpha = \frac{1}{1+\log(\frac{m_1+T}{m_1})}$. As $V$ is the capacity region under erasure-free case and $\alpha < 1$, $\alpha\vec{v}$ is achievable by the "as uniform as possible" intra-session coding under the erasure-free case.
Assume to the contrary that (5) is not satisfied for some $k \in \{1, 2, \ldots, n\}$. Without loss of generality, we may assume that $k$ is the smallest such integer. Then we have $$\sum_{i=1}^{k} q_j^i = 1, \quad \forall j : 1 \leq j \leq m_k - T. \quad (16)$$

Using (16), we get:

$$\alpha m_k \geq \sum_{i=1}^{k} \alpha c_i = \sum_{j=1}^{m_k} \sum_{i=1}^{k} q_j^i \geq \sum_{j=1}^{m_k-T} \sum_{i=1}^{k} q_j^i = m_k - T,$$

which implies:

$$m_k \leq \frac{T}{1-\alpha}. \quad (17)$$

Let's first prove that $$m_k < m_1 + 2T. \quad (18)$$

Using (17), we get $$m_k \leq \frac{T}{1-\alpha} = \frac{T}{1 - \frac{1}{1+\log(\frac{m_1+T}{m_1})}} = \frac{T(1+\log(\frac{m_1+T}{m_1}))}{\log(\frac{m_1+T}{m_1})}.$$

Hence it is enough to show that $$\frac{T(1+\log(\frac{m_1+T}{m_1}))}{\log(\frac{m_1+T}{m_1})} \le m_1 + 2T. \quad (19)$$

Let $x = \frac{T}{m_1}$. Then, (19) is equivalent to:

$$g(x) = (1+\frac{1}{x})\log(1+x) \ge 1, \quad (20)$$

which follows immediately by the fact that $g'(x) > 0$ and $\lim_{x \to 0} g(x) = 1$.

Let $t$ be the smallest integer satisfying $m_t \ge m_k - T + 1$. Hence, $$m_{t-1} < m_k - T. \quad (21)$$

Let $s$ be the smallest integer satisfying $$\sum_{i=1}^{s+1} \frac{\alpha v_k}{m_i} \ge 1. \quad (22)$$

Let $X = v_1 + v_2 + \ldots + v_{s-1}$, $Y = v_1 + v_2 + \ldots + v_{s+1}$. Using (22) we get:

$$1 \le \sum_{i=1}^{s+1} \frac{\alpha v_i}{m_i} < \alpha + \sum_{i=1}^{\lfloor Y \rfloor - m_1} \frac{\alpha}{m_1 + i} + \frac{\alpha(Y - \lfloor Y \rfloor)}{Y}$$

$$< \alpha \left(1 + \sum_{i=1}^{\lfloor Y \rfloor - m_1} \frac{1}{m_1 + i} + \frac{(Y - \lfloor Y \rfloor)}{Y}\right)$$

$$< \alpha \left(1 + \log(\frac{Y}{m_1})\right).$$

Hence, $$Y > m_1 + T. \quad (23)$$

As $m_{s+1} \ge Y$, (18), (21) and (23) implies:

$$m_{s+1} \ge Y > m_1 + T \ge m_k - T + 1 > m_{t-1},$$

which implies:

$$s + 1 \ge t.$$

Let $p_i$ denote the length of the uniform block for $i$-th receiver. Let $r = m_k - T + 1$. By assumption, $p_k < T$, which implies:

$$\sum_{i=r}^{k-1} q_r^i + \frac{\alpha v_k}{T} > 1. \quad (24)$$

As $p_i \ge T$ for $i \in \{1, 2, \ldots, k-1\}$, and $q_r^i \le \alpha v_i/p_i$, (24) implies:

$$1 < \sum_{i=r}^{k-1} q_r^i + \frac{\alpha v_k}{T} = \sum_{i=t}^{s} \frac{\alpha v_i}{m_i} + \sum_{i=s+1}^{k-1} q_r^i + \frac{\alpha v_k}{T}$$

$$< \sum_{i=t}^{s} \frac{\alpha v_i}{m_i} + q_r^{s+1} + \sum_{i=s+2}^{k-1} \frac{\alpha v_i}{p_i} + \frac{\alpha v_k}{T}$$

$$\le \sum_{i=t}^{s} \frac{\alpha v_i}{m_i} + q_r^{s+1} + \sum_{i=s+2}^{k} \frac{\alpha v_i}{T}.$$

Let $S = \sum_{i=t}^{s} \frac{\alpha v_i}{m_i} + q_r^{s+1} + \sum_{i=s+2}^{k} \frac{\alpha v_i}{T}$. Let's maximize $S$ under the condition (22). As increasing $v_{s+2}$ and decreasing $v_{s+1}$ at the same amount increases $S$, we may assume that equality is satisfied in (22), i.e.

$$\sum_{i=t}^{s+1} \frac{v_i}{m_i} = \frac{1}{\alpha} = 1 + \log(\frac{m_1 + T}{m_1}). \quad (25)$$

Hence $$S = \sum_{i=t}^{s+1} \frac{\alpha v_i}{m_i} + \sum_{i=s+2}^{k} \frac{\alpha v_i}{T} \ge 1. \quad (26)$$

Let $$h(v_1, v_2, \ldots, v_k) = \sum_{i=t}^{s+1} \frac{v_i}{m_i} + \sum_{i=s+2}^{k} \frac{v_i}{T}.$$

Let's prove that $$h(v_1, v_2, \ldots, v_k) \le \frac{1}{\alpha} = 1 + \log(\frac{m_1 + T}{m_1}), \quad (27)$$

which will contradict (26). As $$h(v_1, v_2, \ldots, v_k) \le \sum_{i=t}^{s+1} \frac{v_i}{m_i} + \frac{m_k - Y}{T},$$

in order to verify (27), it is enough to show that $$\sum_{i=t}^{s+1} \frac{v_i}{m_i} + \frac{m_k - Y}{T} \le \frac{1}{\alpha}. \quad (28)$$

Using (25), (28) is equivalent to:

$$T \sum_{i=1}^{t-1} \frac{v_i}{m_i} + Y \ge m_k. \quad (29)$$

Let $$\beta = \sum_{i=1}^{t-1} \frac{v_i}{m_i}.$$

Then, clearly $$X = \sum_{i=1}^{t-1} v_i \ge m_1 \sum_{i=1}^{t-1} \frac{v_i}{m_i} = m_1 \beta, \quad (30)$$

$$Y - X = \sum_{i=t}^{s+1} v_i \ge m_t \sum_{i=t}^{s+1} \frac{v_i}{m_i} = m_t(\frac{1}{\alpha} - \beta). \quad (31)$$

We will consider two cases:

Case (1): $m_t \ge m_1 + T$.

Using (30) and (31), we get, $$T\sum_{i=1}^{t-1} \frac{v_i}{m_i} + Y = T\beta + X + Y - X$$

$$\ge T\beta + m_1\beta + (\frac{1}{\alpha} - \beta)m_t$$

$$\ge T\beta + m_1\beta + (\frac{1}{\alpha} - \beta)(m_1 + T)$$

$$= \frac{m_1 + T}{\alpha} > m_1 + 2T. \quad (32)$$

where the last inequality is equivalent to $\log(1+t) \geq \frac{t}{t+1}$ after setting $t = T/m_1$, hence follows from the inequality (20). As (32) implies (29), and (29) is equivalent to (27), we get a contradiction.

Case (2): $m_t < m_1 + T$.

If $\beta \geq 1$, as $Y \geq m_1 + T$, we have $$T\sum_{i=1}^{t-1} \frac{v_i}{m_i} + Y = T\beta + Y \geq m_1 + 2T \geq m_k,$$

which establishes (29). Hence we get a contradiction.

We may assume that $\beta < 1$. Using (23), we have $Y > m_1 + T > m_t$. Hence $$\frac{1}{\alpha} - \beta = \sum_{i=t}^{s+1} \frac{v_i}{m_i} \leq \frac{m_t - X}{m_t} + \log(\frac{Y}{m_t}),$$

which is equivalent to:

$$Y \geq m_t e^{\frac{1}{\alpha} - \beta + \frac{X}{m_t} - 1}. \qquad (33)$$

Using (30) and (33), we get:

$$T\sum_{i=1}^{t-1} \frac{v_i}{m_i} + Y = T\beta + Y$$
$$\geq T\beta + m_t e^{\frac{1}{\alpha} - \beta + \frac{X}{m_t} - 1}$$
$$\geq T\beta + m_t e^{\frac{1}{\alpha} - \beta + \frac{m_1 \beta}{m_t} - 1}$$
$$= T\beta + m_t e^{1 + \log(1 + \frac{T}{m_1}) - \beta + \frac{m_1 \beta}{m_t} - 1}$$
$$= T\beta + m_t(1 + \frac{T}{m_1})e^{\beta(\frac{m_1}{m_t} - 1)}. \qquad (34)$$

Let $f(x) = Tx + m_t(1 + \frac{T}{m_1})e^{x(\frac{m_1}{m_t} - 1)}$. Then, $$f'(x) = T + m_t(1 + \frac{T}{m_1})(\frac{m_1}{m_t} - 1)e^{x(\frac{m_1}{m_t} - 1)}$$
$$\geq T + m_t(1 + \frac{T}{m_1})(\frac{m_1}{m_t} - 1)$$
$$= T + (1 + \frac{T}{m_1})(m_1 - m_t). \qquad (35)$$

If $T + (1 + \frac{T}{m_1})(m_1 - m_t) \leq 0$, using (34) and (35) we get:

$$T\sum_{i=1}^{t-1} \frac{v_i}{m_i} + Y$$
$$\geq f(\beta)$$
$$\geq f(0) + \beta[T + (1 + \frac{T}{m_1})(m_1 - m_t)]$$
$$= m_t(1 + \frac{T}{m_1}) + \beta[T + (1 + \frac{T}{m_1})(m_1 - m_t)]$$
$$\geq m_t(1 + \frac{T}{m_1}) + [T + (1 + \frac{T}{m_1})(m_1 - m_t)]$$
$$= m_1 + 2T \geq m_k,$$

which establishes (29). Hence we get a contradiction.

If $T + (1 + \frac{T}{m_1})(m_1 - m_t) > 0$, using (34) and (35) we get:

$$T \sum_{i=1}^{t-1} \frac{a_i}{m_i} + Y \geq f(\beta) \geq f(0) = m_t(1 + \frac{T}{m_1}) \geq m_t + T$$
$$\geq m_k,$$

which establishes (29), again we get a contradiction. ∎

*Proof of Lemma 4:* As $U \subset V$, if $p \leq \frac{1}{T}$, then clearly $U \subset (1 - p + \frac{1}{T})V$.

Let $p > \frac{1}{T}$. Define $q = 1 - p + \frac{1}{T}$.

Define $Z \subset \mathcal{I}$ as $$|Z \cap \{l_1, l_2, \ldots, l_k\}| = \lfloor qk \rfloor \quad \forall k : 1 \leq k \leq m_k.$$

As $0 \leq q < 1$, $Z$ is well-defined and unique. Let's prove that $Z$ is a $(p, T)$-unerased subset of $\mathcal{I}$. Let $t \geq T$ and $0 \leq i \leq m_n - t$. We have:

$$|Z \cap \{l_{i+1}, l_{i+2}, \ldots, l_{i+t}\}| = \lfloor q(i + t) \rfloor - \lfloor qi \rfloor$$
$$> q(i + t) - qi - 1$$
$$= (1 - p + \frac{1}{T})t - 1$$
$$\geq (1 - p)t,$$

as desired.

Let $(u_1, u_2, \ldots u_n) \in U$. Applying cut-set bounds for $Z$, we have:

$$\sum_{i=1}^{k} u_i \leq |Z \cap \{l_1, l_2, \ldots, l_{m_k}\}| = \lfloor qm_k \rfloor \leq qm_k,$$

which implies that $U \subset qV = (1 - p + \frac{1}{T})V$, as desired. ∎

*Proof of Lemma 5:* Let $\vec{v} \in V$. Let $\alpha = \frac{1}{1 + \log(\frac{m_1 + T}{m_1})}$.

By Lemma 3, the rate vector $\alpha \vec{v}$ is achievable by the "as uniform as possible" intra-session coding in a such way that the corresponding allocation $q$ satisfies:

$$q^i_{m_i - T + 1} = q^i_{m_i - T + 2} = \ldots = q^i_{m_i} \quad \forall i : 1 \leq i \leq n.$$

Let $Q_i = \{q^i_{m_i}, q^i_{m_i - 1}, \ldots, q^i_1\}$. We know that $q^i_{m_i} \geq q^i_{m_i - 1} \geq \ldots \geq q^i_1$. Let $Q'_i$ be a $(p, T)$-unerased subset of $Q_i$. By Lemma 2:

$$\|Q'_i\| \geq (1 - p)\|Q_i\| = (1 - p)\alpha v_i.$$

Hence $(1 - p)\alpha \vec{v} \in W$, which establishes (7). ∎

What is claimed is:

1. A computer-implemented method for error correction coding for streaming communication, comprising:
   (a) utilizing, in a computer, a coding scheme defined below in terms of a non-multicast network problem with a nested receiver structure, wherein each packet of multiple packets in a streaming problem corresponds to a link in the non-multicast network problem and each deadline of multiple deadlines in the streaming problem corresponds to a receiver in the nested receiver structure in the non-multicast network problem, wherein:
      (i) each receiver of multiple receivers in the nested receiver structure is required to decode specific messages $\{M_1, M_2, \ldots M_n\}$, from content of received packets, at given time steps $\{m_1, m_2, \ldots m_n\}$ respectively; and
      (ii) each of the multiple receivers in the nested receiver structure has access to a subset of the content received by another receiver in the nested receiver structure; and
   (b) allocating, in the computer, the content into the multiple packets, wherein:
      no coding occurs across information demanded by different receivers in the nested receiver structure;
      (ii) a capacity region defines a set of information rate vectors $\{u_1, u_2, \ldots u_n\}$, that can be communicated to the multiple receivers in the nested receiver structure successfully;
      (iii) an information rate vector $(u_1, u_2, \ldots, u_n)$ from the set of information rate vectors is successfully communicated if:
         (1) a sum of amounts $(y_i^j)$ of the information corresponding to a message $M_j$ transmitted on unerased links $l_i$, is greater than or equal to $u_j$ for each of one or more erasure patterns per:

$$\forall j: 1 \leq j \leq n \quad u_j \leq \sum_{i \in P \cap \{1,\ldots,m_j\}} y_i^j$$

where P denotes a set of unerased links for each erasure pattern; and
         (2) the sum of $y_i^j$ for $1 \leq j \leq n$ is less than or equal to 1 per:

$$\forall i: 1 \leq i \leq m_n \quad \sum_{j=1}^{n} y_i^j \leq 1.$$

2. The method of claim 1, wherein a code for a uniform erasure model ensures that the sums are satisfied for every set of packets P that are unerased where $|P| \geq m_n - z$.

3. The method of claim 1, further comprising:
   defining, in the computer, for a given information rate vector $(u_1, u_2, \ldots, u_n)$ from the set of information rate vectors:
      a triangular n×n rate allocation matrix T and auxiliary variables $t_{i,j} \square \Sigma_{k=j}^{i} T_{k,j}, d_{i,j} \square \Sigma_{k=1}^{j} (m_k - m_{k-1}) T_{i,k}$, and $s_i$, calculating the entries of the matrix T by:

$$T_{1,1} = \frac{u_1}{m_1 - z}, t_{1,1} = \frac{u_1}{m_1 - z}, d_{1,1} = \frac{m_1 u_1}{m_1 - z}, s_1 = 0,$$

$$m_0 = 0$$

for i = 2 → n do
{allocation for sink i on links $l_{m_{j-1}+1}, \ldots, l_{m_j}$}
$d_{i,0} = 0$
j = 1 while $1 - t_{i-1,j} < \frac{u_i - d_{i,j-1}}{m_i - m_{j-1} - z}$ do $T_{i,j} = 1 - t_{i-1,j}$
$t_{i,j} = \Sigma_{k=j}^{i} T_{k,j}$
$d_{i,j} = \Sigma_{k=1}^{j}(m_k - m_{k-1})T_{i,k}$
j ← j + 1
if j > i or $u_i \leq d_{i,j}$ then
    return error {rate vector is unallocable}
end if
end while
$s_i = j - 1$ {the uniform portion follows}
while $j \leq i$ do $$T_{i,j} = \frac{u_i - d_{i,s_i}}{m_i - m_{s_i} - z}$$

$t_{i,j} = \Sigma_{k=j}^{i} T_{k,j}$
$d_{i,j} = \Sigma_{k=1}^{j}(m_k - m_{k-1})T_{i,k}$
j ← j + 1
end while
end for
and setting
$y_i^j = T_{j,k} \forall i: m_{k-1} < i \leq m_k.|$ 4. The method of claim 1, wherein a matrix whose (i,j)th entry corresponds to $y_i^j$ is defined.

5. The method of claim 4, wherein one or more rates are assigned in the matrix based on:
   each row corresponds to a demanded subset of source packets;
   each column corresponds to given time steps $\{m_1, m_2, \ldots m_n\}$;
   each row is processed by assigning a rat; of the one or more rates, comprising the information rate vector (u) of the set of information rate vectors divided by a difference between the given time steps (m) and a number of packet erasures (z):

$$\frac{u_i}{m_j - z},$$

when assigning the rate to a specific cell in a specific row and specific column, if a sum of all assigned rates in the specific column exceeds capacity, the rate that brings the sum equal to or below the capacity is assigned to the specific cell and rates for remaining cells in the specific row are assigned based on remaining available capacity.

6. The method of claim 1, wherein a sliding window erasure model is used to characterize a class of possible erased subsets of the content.

7. The method of claim 1, further comprising applying, in the computer, linear programming subject to an inequality for an arbitrary erasure model comprised of a specified set of erasure patterns.

8. An apparatus for error correction coding for a non-multicast nested receiver structure in a computer system comprising:

(a) a computer having a memory;
(b) an application executing on the computer, wherein the application is configured to:
  (i) utilize a coding scheme defined below in terms of a non-multicast network problem with a nested receiver structure, wherein each packet of multiple packets in a streaming problem corresponds to a link in the non-multicast network problem and each deadline of multiple deadlines in the streaming problem corresponds to a receiver in the nested receiver structure in the non-multicast network problem, wherein:
    (1) each receiver of multiple receivers in the nested receiver structure is required to decode specific messages $\{M_1, M_2, \ldots M_n\}$, from content or received packets, at given time steps $\{m_1, m_2, \ldots m_n\}$ respectively; and
    (2) each of the multiple receivers in the nested receiver structure has access to a subset of the content received by another receiver in the nested receiver structure;
  (ii) allocate the content into the multiple packets, wherein:
    (1) no coding occurs across information demanded by different receivers in the nested receiver structure;
    (2) a capacity region defines a set of information rate vectors $\{u_1, u_2, \ldots, u_n\}$ that can be communicated to the multiple receivers in the nested receiver structure successfully;
    (3) an information rate vector $(u_1, u_2, \ldots, u_n)$ from the set of information rate vectors is successfully communicated if:
      (A) a sum of amounts $(y_i^j)$ of the information corresponding to a message $M_j$ transmitted on unerased links $l_i$, is greater than or equal to $u_j$ for each of one or more erasure patterns per:

$$\forall j : 1 \le j \le n \quad u_j \le \sum_{i \in P \cap \{1, \ldots, m_j\}} y_i^j \bigg|;$$

where P denotes a set of unerased links for each erasure pattern; and
      (B) the sum of $y_i^j$ for $1 \le j \le n$ is less than or equal to 1 per:

$$\forall i : 1 \le i \le m_n \quad \sum_{j=1}^{n} y_i^j \le 1.$$

9. The apparatus of claim 8, wherein a code for a uniform erasure model ensures that the sums are satisfied for every set of packets P that are unerased where $|P| \ge m_n - z$.

10. The apparatus of claim 8, wherein the application is further configured to:
define, for a given information rate vector $(u_1, u_2, \ldots, u_n)$ from the set of information rate vectors:
a triangular n×n rate allocation matrix T and auxiliary variables
$t_{i,j} \square \Sigma_{k=j}^{i} T_{k,j}, d_{i,j} \square \Sigma_{k=1}^{j}(m_k - m_{k-1}) T_{i,k}$, and $s_i$, calculating the entries of the matrix T by:

$$T_{1,1} = \frac{u_1}{m_1 - z}, t_{1,1} = \frac{u_1}{m_1 - z}, d_{1,1} = \frac{m_1 u_1}{m_1 - z}, s_1 = 0,$$

$m_0 = 0$ for i = 2 → n do
  {allocation for sink i on links $l_{m_{j-1}+1}, \ldots, l_{m_j}$}
  $d_{i,0} = 0$
  j = 1 while $1 - t_{i-1,j} < \dfrac{u_i - d_{i,j-1}}{m_i - m_{j-1} - z}$ do $T_{i,j} = 1 - t_{i-1,j}$
    $t_{i,j} = \Sigma_{k=j}^{i} T_{k,j}$
    $d_{i,j} = \Sigma_{k=1}^{j}(m_k - m_{k-1}) T_{i,k}$
    $j \leftarrow j + 1$
    if $j > i$ or $u_i \le d_{i,j}$ then
      return error {rate vector is unallocable}
    end if
  end while
  $s_i = j - 1$ {the uniform portion follows}
  while $j \le i$ do $$T_{i,j} = \frac{u_i - d_{i,s_i}}{m_i - m_{s_i} - z}$$

$t_{i,j} = \Sigma_{k=j}^{i} T_{k,j}$
    $d_{i,j} = \Sigma_{k=1}^{j}(m_k - m_{k-1}) T_{i,k}$
    $j \leftarrow j + 1$
  end while
end for
and setting
  $y_i^j = T_{j,k} \forall i : m_{k-1} < i \le m_k.|$ 11. The apparatus of claim 8, wherein a matrix whose (i,j)th entry corresponds to $y_i^j$ is defined.

12. The apparatus of claim 11, wherein one or more rates are assigned in the matrix based on:
each row corresponds to a demanded subset of source packets;
each column corresponds to given time steps $\{m_1, m_2, \ldots m_n\}$;
each row is processed by assigning a rate, of the one or more rates, comprising the information rate vector (u) of the set of information rate vectors divided by a difference between the given time steps (m) and a number of packet erasures (z):

$$\frac{u_i}{m_j - z},$$

when assigning the rate to a specific cell in a specific row and specific column, if a sum of all assigned rates in the specific column exceeds capacity, the rate that brings the sum equal to or below the capacity is assigned to the specific cell and rates for remaining cells in the specific row are assigned based on remaining available capacity.

13. The apparatus of claim 8, wherein a sliding window erasure model is used to characterize a class of possible erased subsets of the content.

14. The apparatus of claim 8, wherein the application is further configured to apply linear programming subject to an inequality for an arbitrary erasure model comprised of a specified set of erasure patterns.

15. A non-transitory computer readable storage medium encoded with computer program instructions which when accessed by a computer cause the computer to load the program instructions to a memory therein creating a special purpose data structure causing the computer to operate as a specially programmed computer, executing a method of error correction coding for a non-multicast nested receiver structure, comprising:

(a) utilizing, in the specially programmed computer, a coding scheme defined below in terms of a non-multicast network problem with a nested receiver structure, wherein each packet of multiple packets in a streaming problem corresponds to a link in the non-multicast network problem and each deadline of multiple deadlines in the streaming problem corresponds to a receiver in the nested receiver structure in the non-multicast network problem, wherein:
   (i) each receiver of multiple receivers in the nested receiver structure is required to decode specific messages $\{M_1, M_2, \ldots M_n\}$, from content of received packets, at given time steps $\{m_1, m_2, \ldots m_n\}$ respectively; and
   (ii) each of the multiple receivers in the nested receiver structure has access to a subset of the content received by another receiver in the nested receiver structure;

(b) allocating, in the specially programmed computer, the content into the multiple packets, wherein:
   no coding occurs across information demanded by different receivers in the nested receiver structure;
   (ii) a capacity region defines a set of information rate vectors $\{u_1, u_2, \ldots, u_n\}$, that can be communicated to the multiple receivers in the nested receiver structure successfully;
   (iii) an information rate vector $(u_1, u_2, \ldots, u_n)$ from the set of information rate vectors is successfully communicated if:
      (1) a sum of amounts $(y_i^j)$ of the information corresponding to a message $M_j$ transmitted on unerased links $l_i$, is greater than or equal to $u_j$ for each of one or more erasure patterns per:

$$\forall j : 1 \leq j \leq n \quad u_j \leq \sum_{i \in P \cap \{1,\ldots,m_i\}} y_i^j$$

where P denotes a set of unerased links for each erasure pattern; and
      (2) the sum of $y_i^j$ for $1 \leq j \leq n$ is less than or equal to 1 per:

$$\forall i : 1 \leq i \leq m_n \quad \sum_{j=1}^{n} y_i^j \leq 1.$$

16. The non-transitory computer readable storage medium of claim 15, wherein a code for a uniform erasure model ensures that the sums are satisfied for every set of packets P that are unerased where $|P| \geq m_n - z$.

17. The non-transitory computer readable storage medium of claim 15, further comprising:
defining, in the specially programmed computer, for a given information rate vector $(u_1, u_2, \ldots, u_n)$ from the set of information rate vectors:
a triangular n×n rate allocation matrix T and auxiliary variables
$t_{i,j} \square \Sigma_{k=j}^{i} T_{k,j}, d_{i,j} \square \Sigma_{k=1}^{j}(m_k - m_{k-1})T_{i,k}$, and $s_i$, calculating the entries of the matrix T by:

$$T_{1,1} = \frac{u_1}{m_1 - z}, \, t_{1,1} = \frac{u_1}{m_1 - z}, \, d_{1,1} = \frac{m_1 u_1}{m_1 - z}, \, s_1 = 0,$$

$$m_0 = 0$$

for i = 2 → n do
  {allocation for sink i on links $l_{m_{j-1}+1}, \ldots, l_{m_j}$}
  $d_{i,0} = 0$
  j = 1 while $1 - t_{i-1,j} < \dfrac{u_i - d_{i,j-1}}{m_i - m_{j-1} - z}$ do $T_{i,j} = 1 - t_{i-1,j}$
    $t_{i,j} = \Sigma_{k=j}^{i} T_{k,j}$
    $d_{i,j} = \Sigma_{k=1}^{j}(m_k - m_{k-1})T_{i,k}$
    $j \leftarrow j + 1$
    if j > i or $u_i \leq d_{i,j}$ then
       return error {rate vector is unallocable}
    end if
  end while
  $s_i = j - 1$ {the uniform portion follows}
  while $j \leq i$ do $T_{i,j} = \dfrac{u_i - d_{i,s_i}}{m_i - m_{s_i} - z}$ $t_{i,j} = \Sigma_{k=j}^{i} T_{k,j}$
    $d_{i,j} = \Sigma_{k=1}^{j}(m_k - m_{k-1})T_{i,k}$
    $j \leftarrow j + 1$
  end while
end for
and setting
$y_i^j = T_{j,k} \, \forall i : m_{k-1} < i \leq m_k.|$

18. The non-transitory computer readable storage medium of claim 15, wherein a matrix whose (i,j)th entry corresponds to $y_i^j$ is defined.

19. The non-transitory computer readable storage medium of claim 18, wherein one or more rates are assigned in the matrix based on:
each row corresponds to a demanded subset of source packets;
each column corresponds to given time steps $\{m_1, m_2, \ldots m_n\}$;
each row is processed by assigning a rate, of the one or more rates, comprising the information rate vector (u) of the set of information rate vectors, divided by a difference between the given time steps (m) and a number of packet erasures (z):

$$\frac{u_i}{m_j - z},$$

when assigning the rate to a specific cell in a specific row and specific column, if a sum of all assigned rates in the specific column exceeds capacity, the rate that brings the sum equal to or below the capacity is assigned to the specific cell and rates for remaining cells in the specific row are assigned based on remaining available capacity.

20. The non-transitory computer readable storage medium of claim 15, wherein a sliding window erasure model is used to characterize a class of possible erased subsets of the content.

21. The non-transitory computer readable storage medium of claim 15, further comprising applying linear programming subject to an inequality for an arbitrary erasure model comprised of a specified set of erasure patterns.

* * * * *